(12) United States Patent
Kumagai et al.

(10) Patent No.: US 12,003,878 B2
(45) Date of Patent: Jun. 4, 2024

(54) IMAGING DEVICE

(71) Applicant: SONY SEMICONDUCTOR SOLUTIONS CORPORATION, Kanagawa (JP)

(72) Inventors: Yoshimichi Kumagai, Kanagawa (JP); Takashi Abe, Kanagawa (JP); Ryoto Yoshita, Kanagawa (JP); Masashi Bando, Kanagawa (JP); Naoyuki Osawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 340 days.

(21) Appl. No.: 17/421,569

(22) PCT Filed: Jan. 8, 2020

(86) PCT No.: PCT/JP2020/000237
§ 371 (c)(1),
(2) Date: Jul. 8, 2021

(87) PCT Pub. No.: WO2020/149181
PCT Pub. Date: Jul. 23, 2020

(65) Prior Publication Data
US 2022/0103775 A1    Mar. 31, 2022

(30) Foreign Application Priority Data

Jan. 17, 2019   (JP) .................. 2019-006285

(51) Int. Cl.
*H04N 25/77* (2023.01)
*H01L 27/146* (2006.01)

(52) U.S. Cl.
CPC ........... *H04N 25/77* (2023.01); *H01L 27/146* (2013.01)

(58) Field of Classification Search
None
See application file for complete search history.

(56) References Cited

U.S. PATENT DOCUMENTS 8,208,054 B2 * 6/2012 Yamaguchi ....... H01L 27/14643
                                                    348/300
2006/0231739 A1   10/2006 Sekine et al.
(Continued)

FOREIGN PATENT DOCUMENTS

CN       1848925 A      10/2006
CN     110419107 A      11/2019
(Continued)

OTHER PUBLICATIONS

International Search Report and Written Opinion of PCT Application No. PCT/JP2020/000237, dated Mar. 24, 2020, 09 pages of ISRWO.

*Primary Examiner* — Cynthia Segura
(74) *Attorney, Agent, or Firm* — CHIP LAW GROUP

(57) ABSTRACT

An imaging device including an imaging unit in which a plurality of shared sections each including two pixel regions adjacent at least in a first direction is provided and the shared sections provided at closest positions in a second direction are disposed to shift in the first direction by the one pixel region, a photoelectric converter provided for each of the pixel regions, an electric charge holding unit that holds signal charge generated by the photoelectric converter, an electric charge voltage converter to which the signal charge is transferred from the electric charge holding unit, and a pixel transistor that is electrically coupled to the electric charge voltage converter. The second direction intersects the first direction. The pixel transistor is provided for each of the shared sections.

10 Claims, 26 Drawing Sheets

(56) References Cited

U.S. PATENT DOCUMENTS

| | | | |
|---|---|---|---|
| 2009/0201405 A1 | 8/2009 | Mori et al. | |
| 2011/0278653 A1* | 11/2011 | Ohta | H01L 27/14612 |
| | | | 257/292 |
| 2013/0146748 A1* | 6/2013 | Ishiwata | H01L 27/14641 |
| | | | 250/208.1 |
| 2014/0267858 A1 | 9/2014 | Ohtsuki et al. | |
| 2018/0151616 A1* | 5/2018 | Sekine | H04N 25/778 |

FOREIGN PATENT DOCUMENTS

| | | |
|---|---|---|
| JP | 2005-110104 A | 4/2005 |
| JP | 2006-302970 A | 11/2006 |
| JP | 2009-026984 A | 2/2009 |
| JP | 2009-188049 A | 8/2009 |
| JP | 2015-228510 A | 12/2015 |
| JP | 2018-160485 A | 10/2018 |
| WO | 2013/084406 A1 | 6/2013 |
| WO | 2018/173788 A1 | 9/2018 |

\* cited by examiner

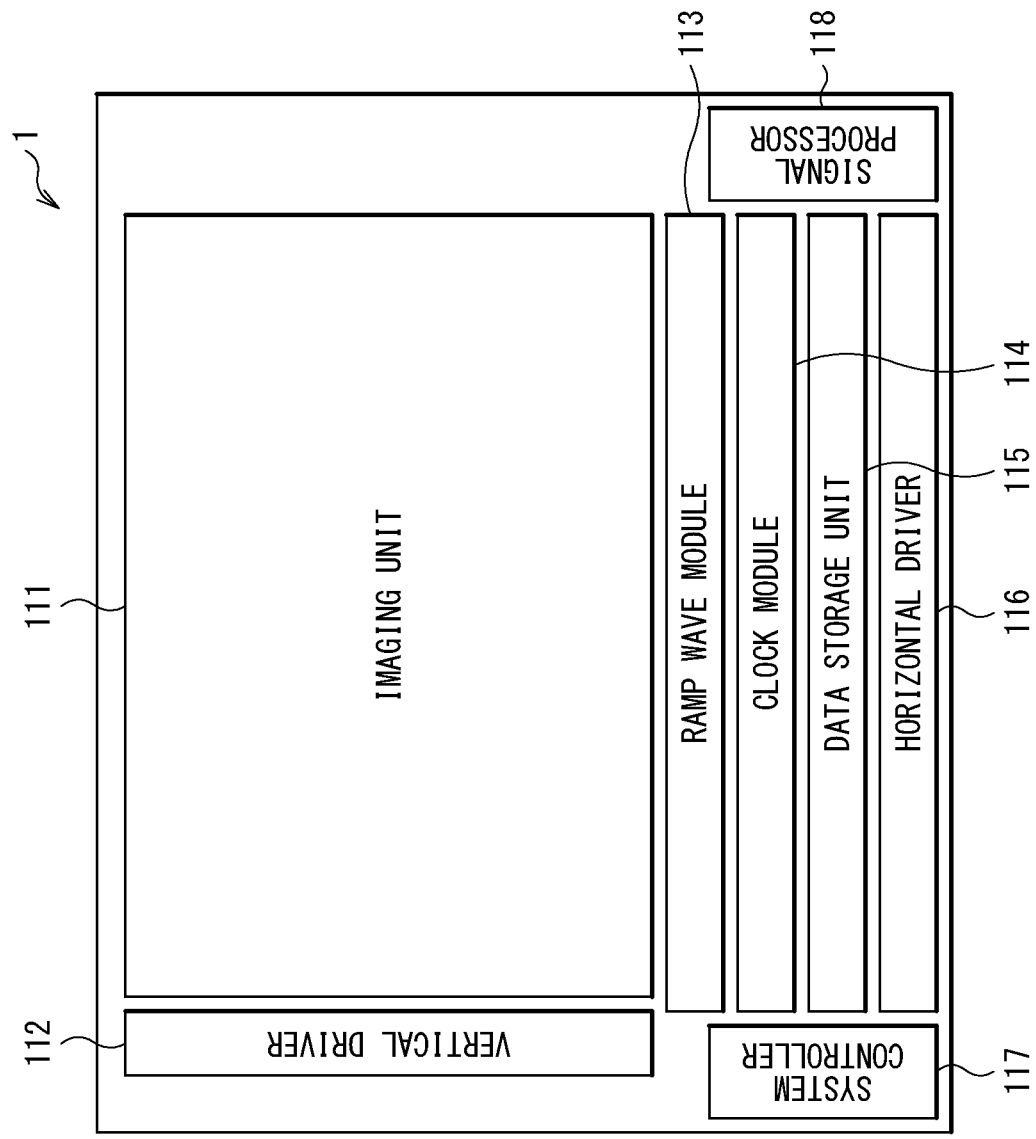
[FIG. 1]

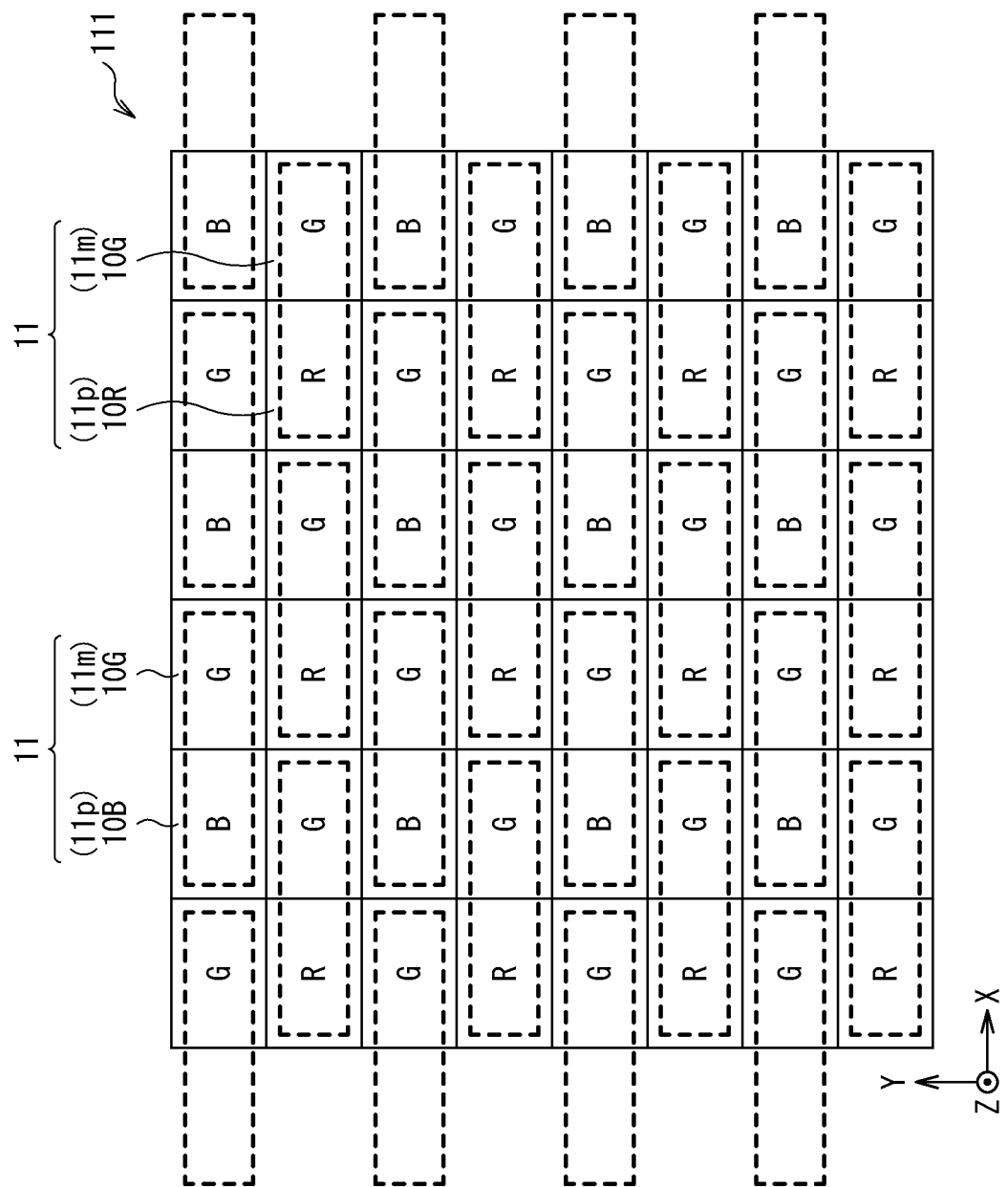
[FIG. 2]

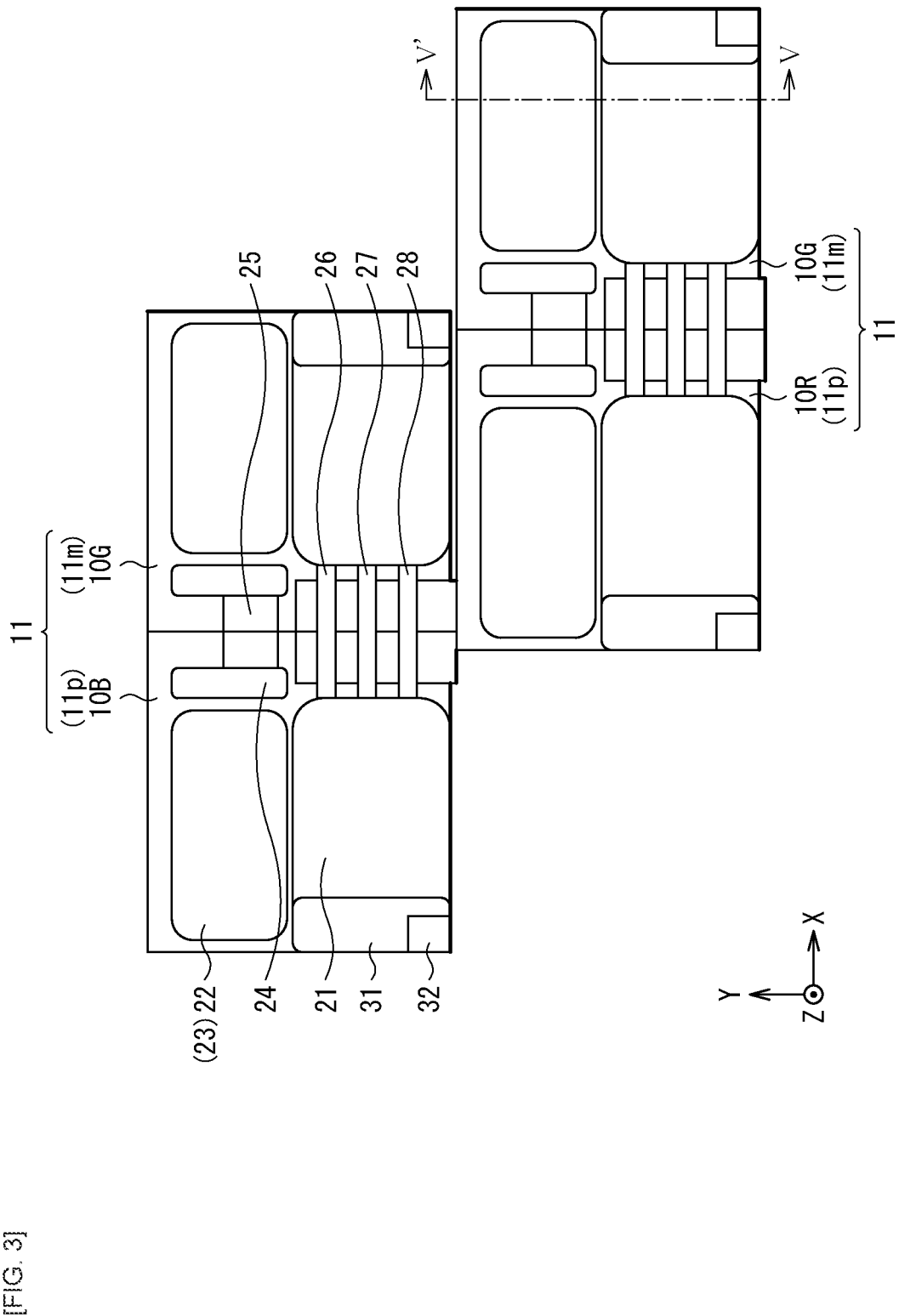
[FIG. 3]

[FIG. 4]
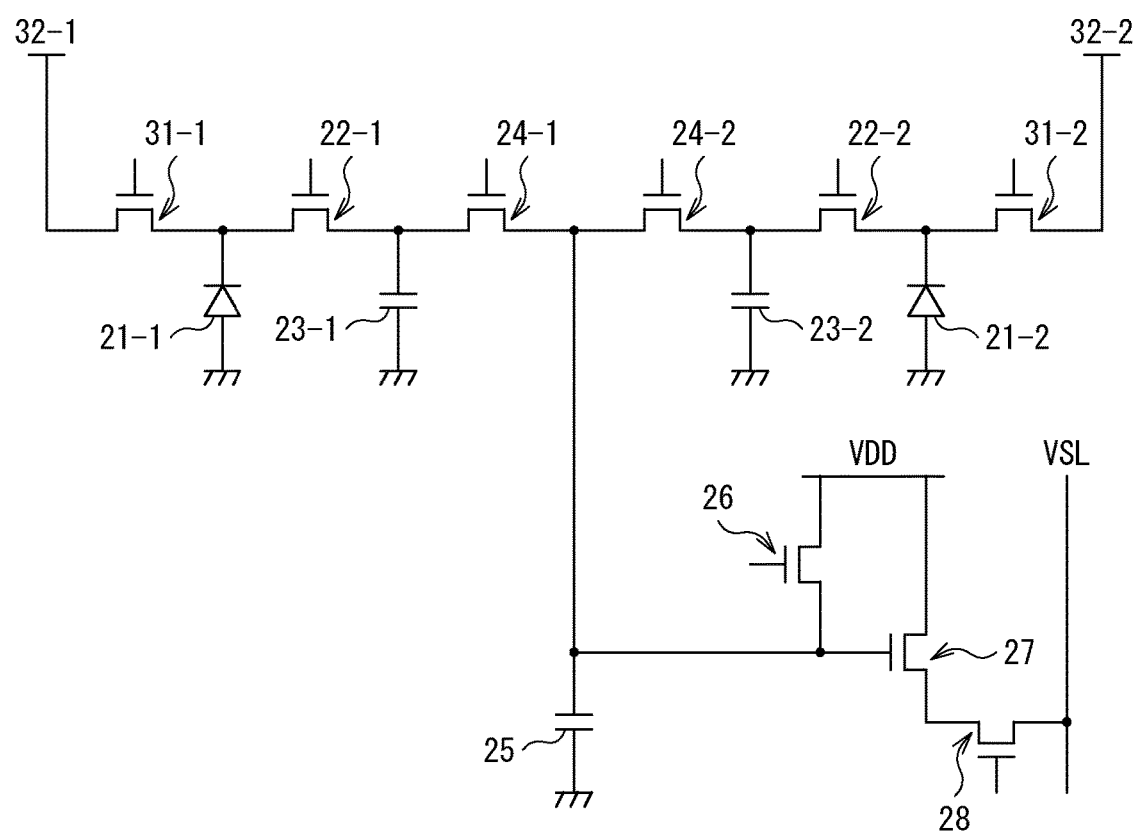

[FIG. 5]
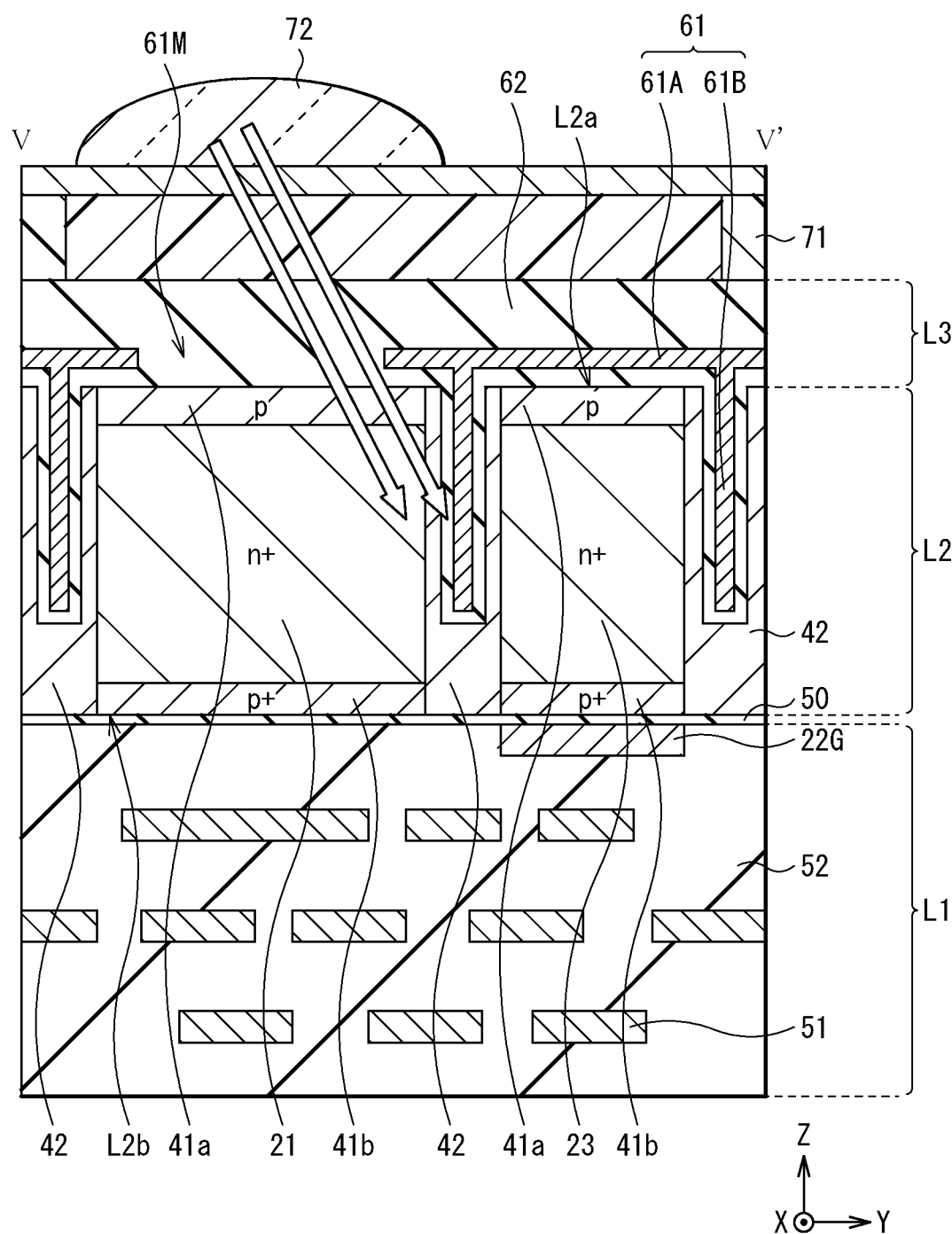

[FIG. 6]
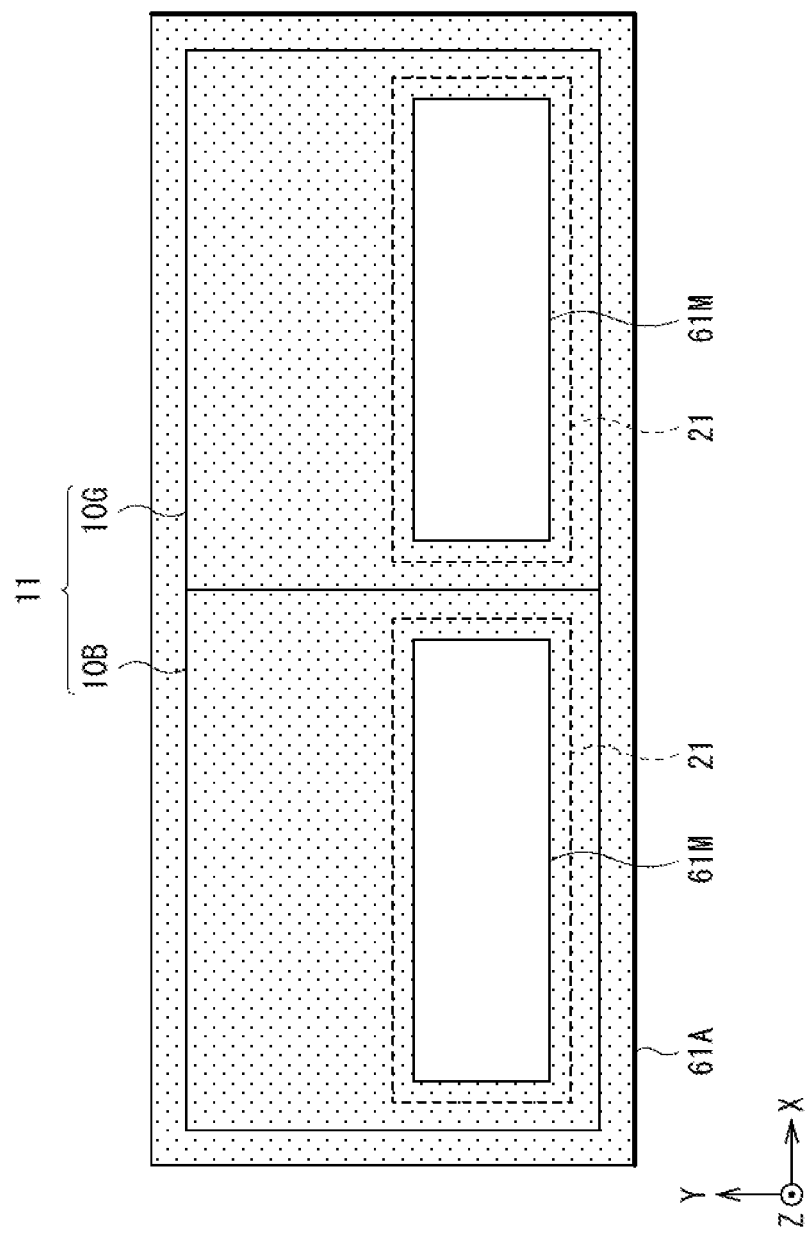

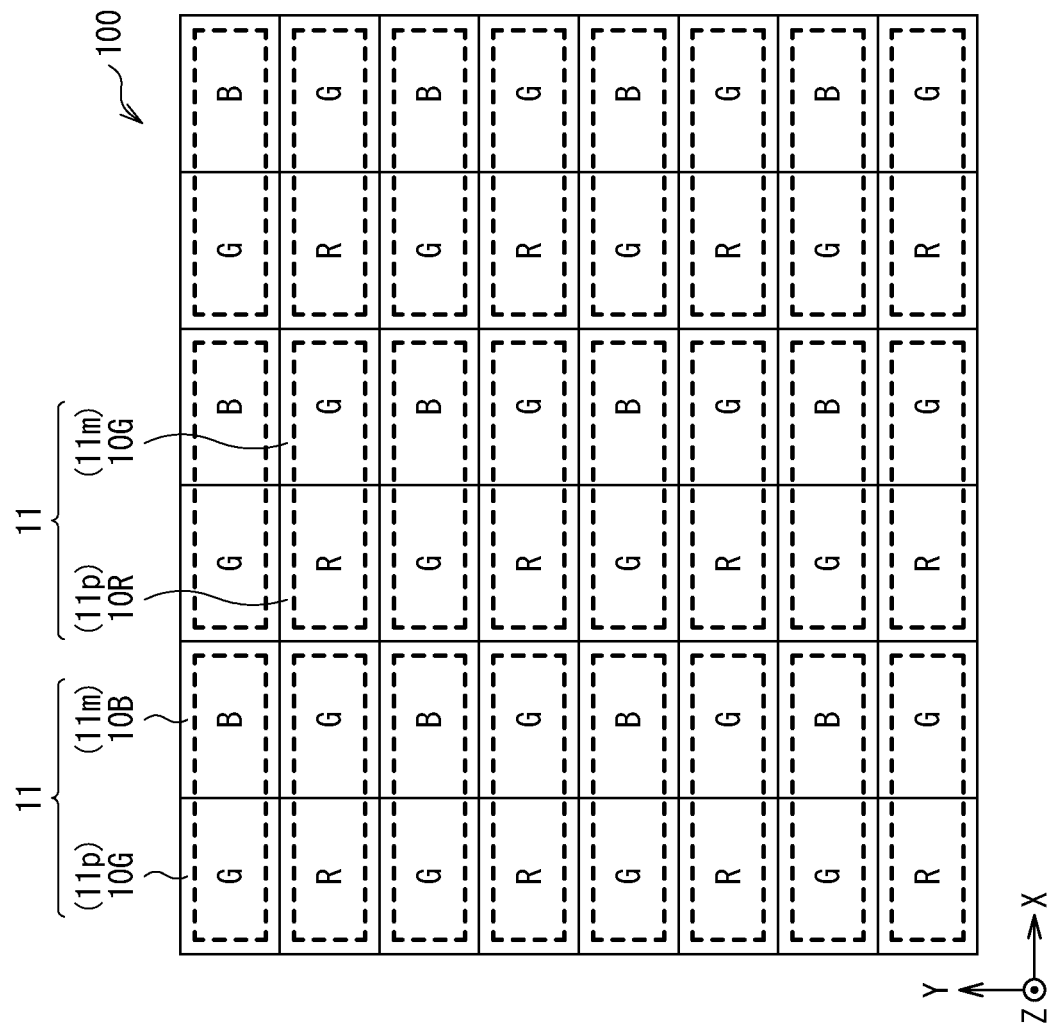

[FIG. 8]
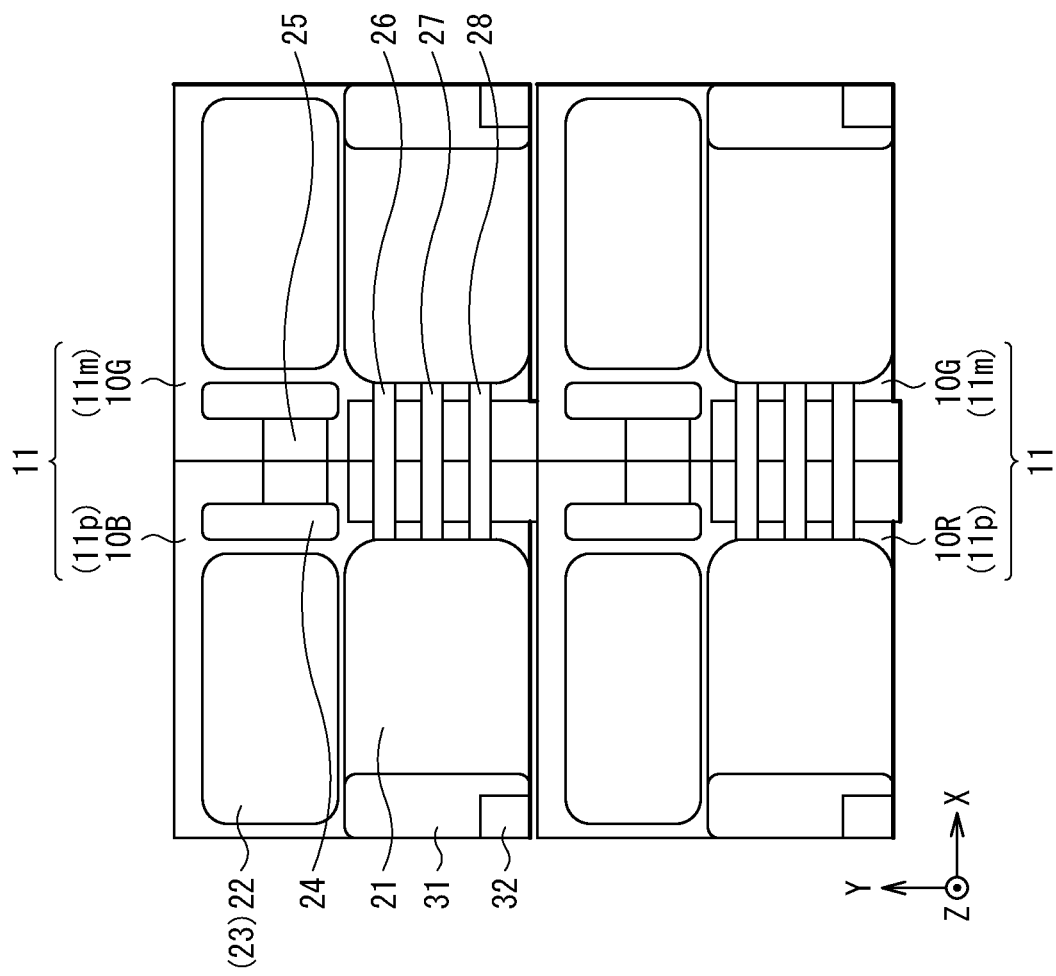

[FIG. 9]
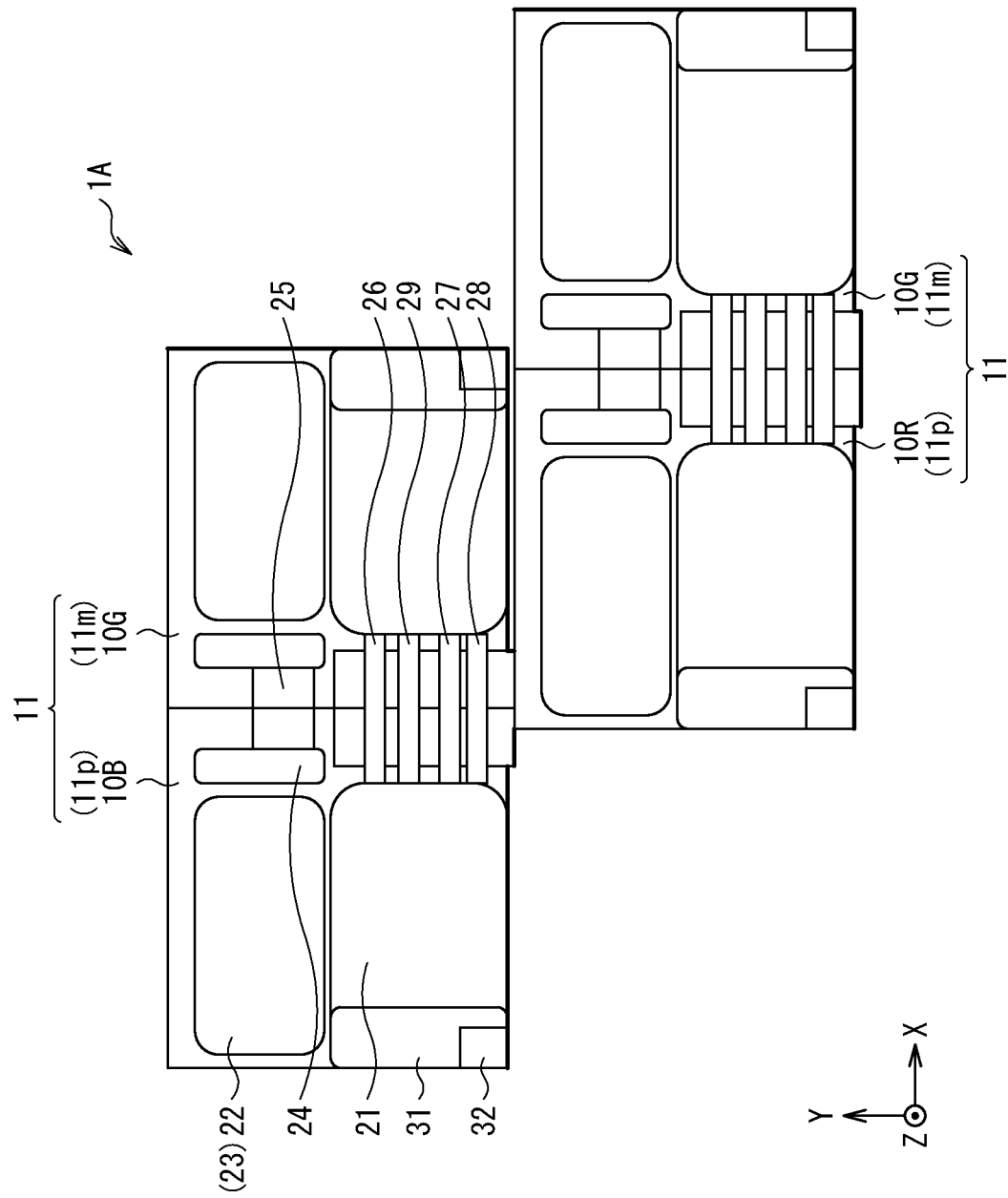

[FIG. 10]
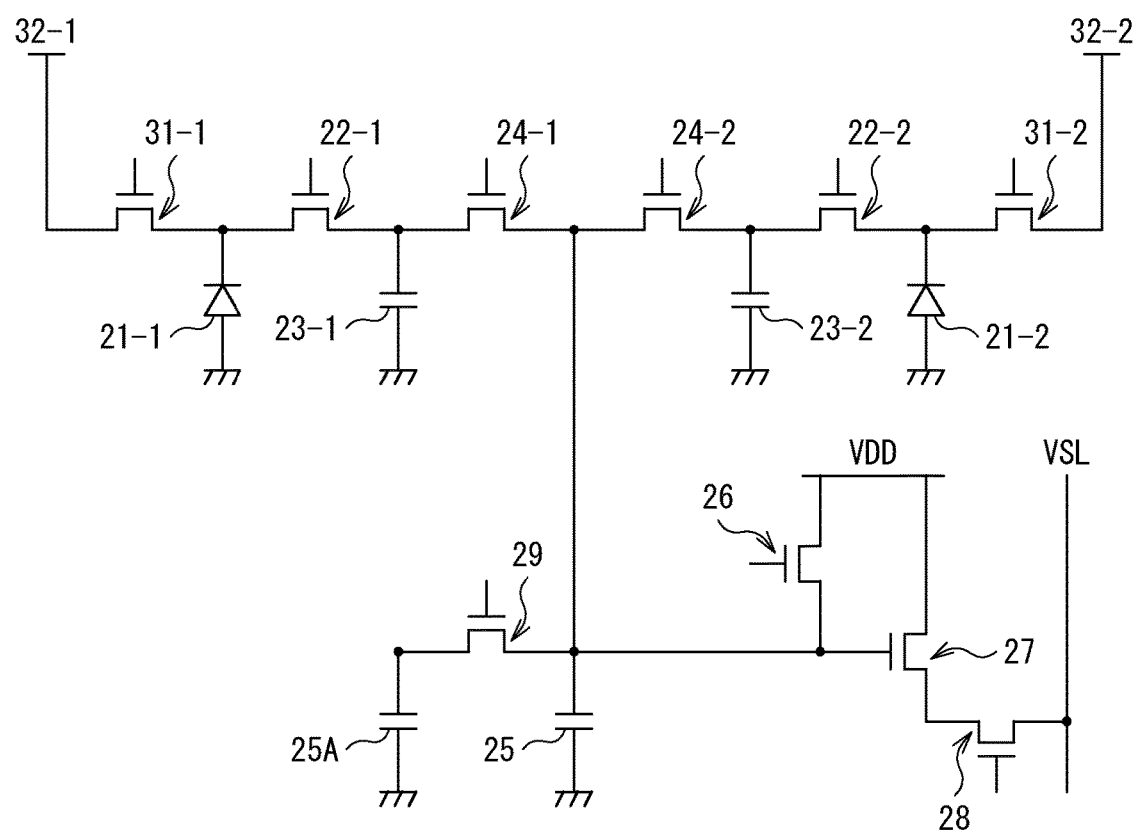

[FIG. 11]
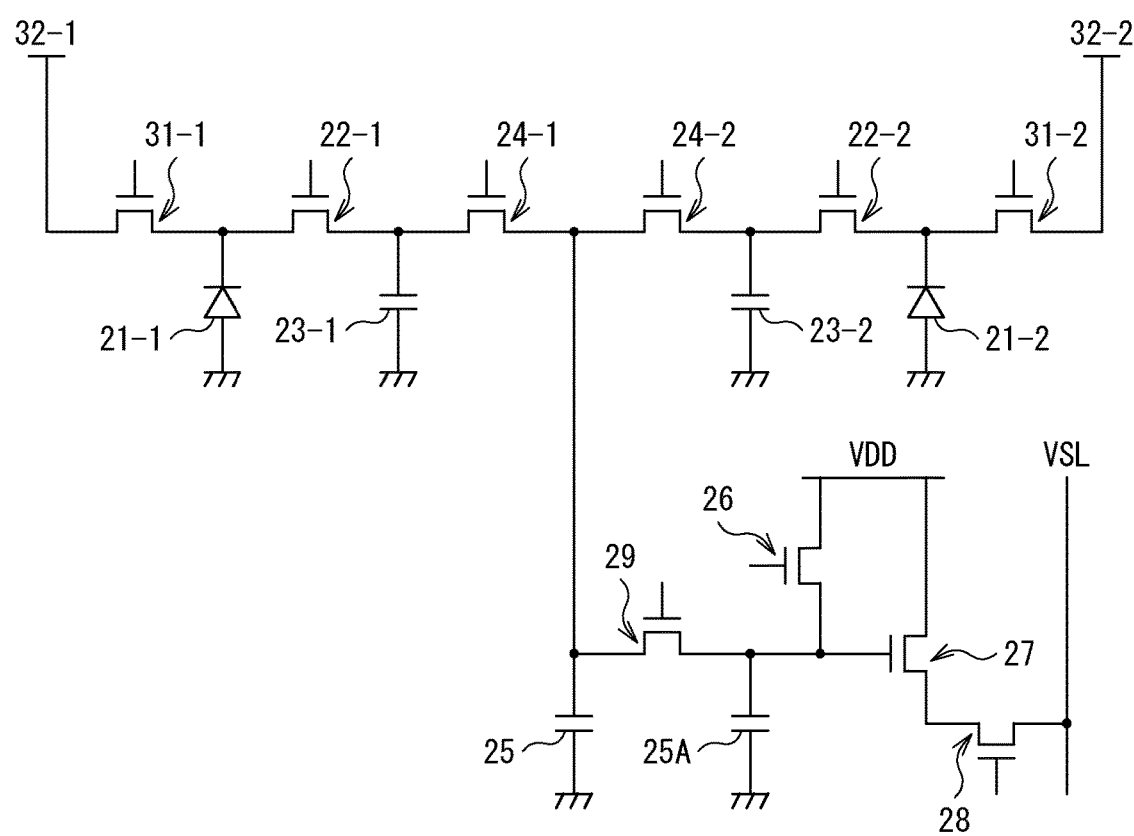

[FIG. 12A]
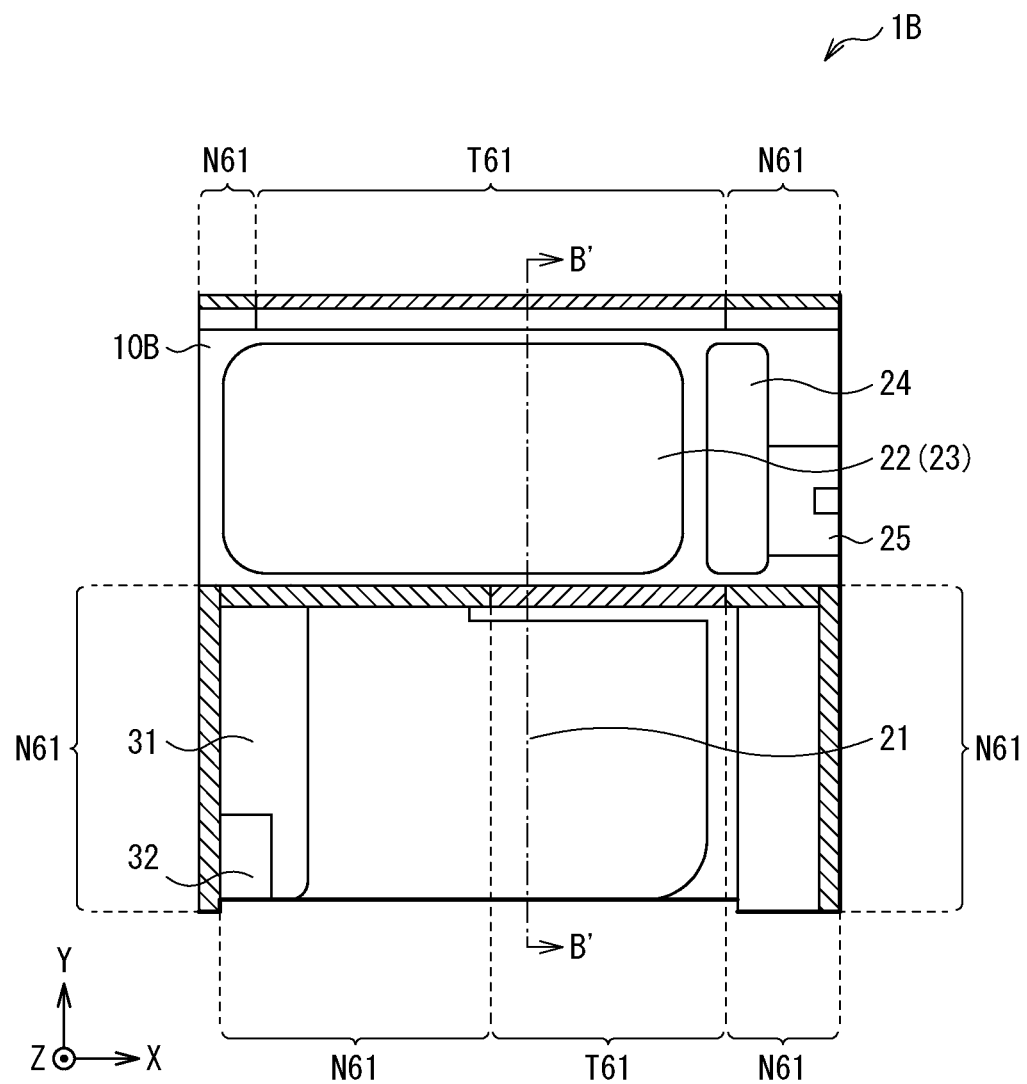

[FIG. 12B]
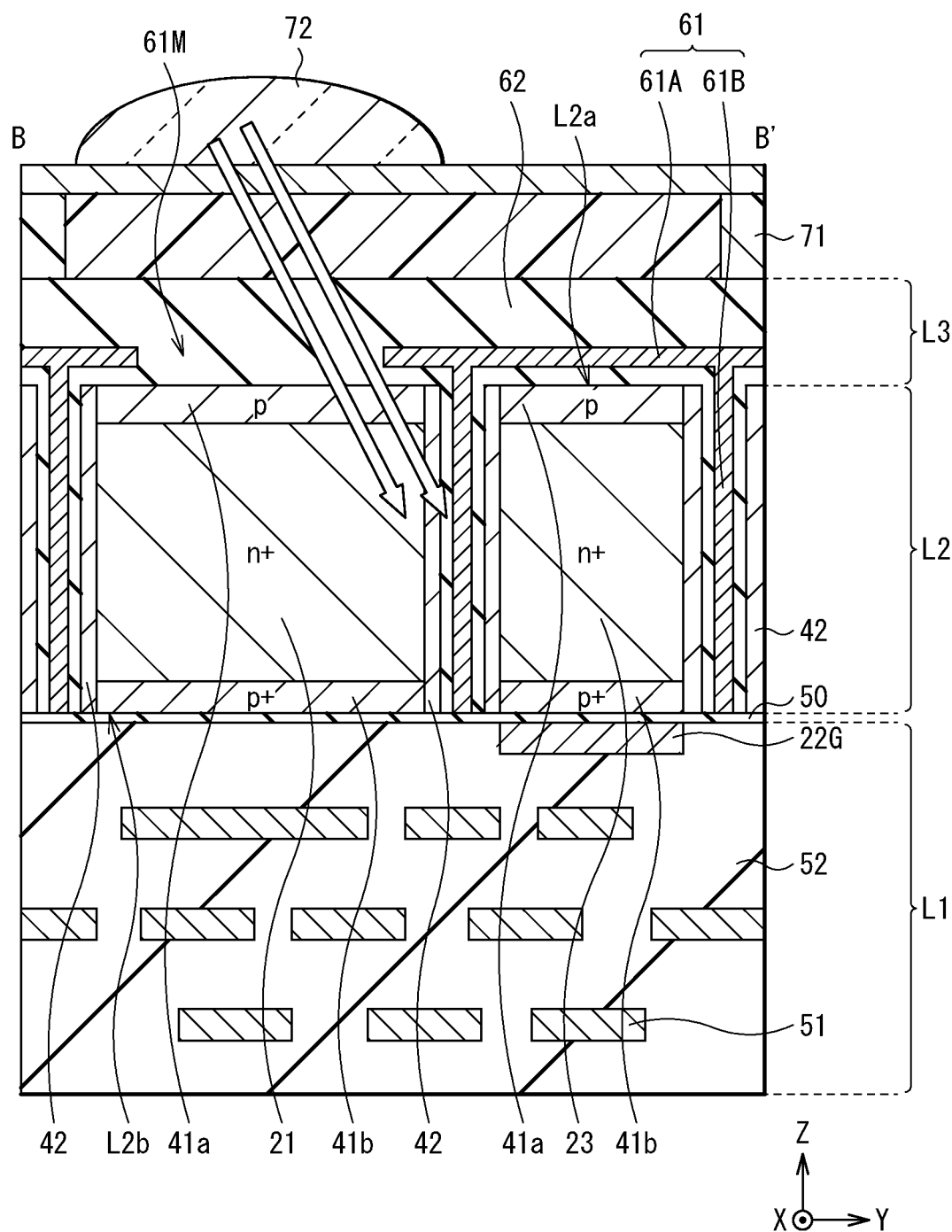

[FIG. 13]
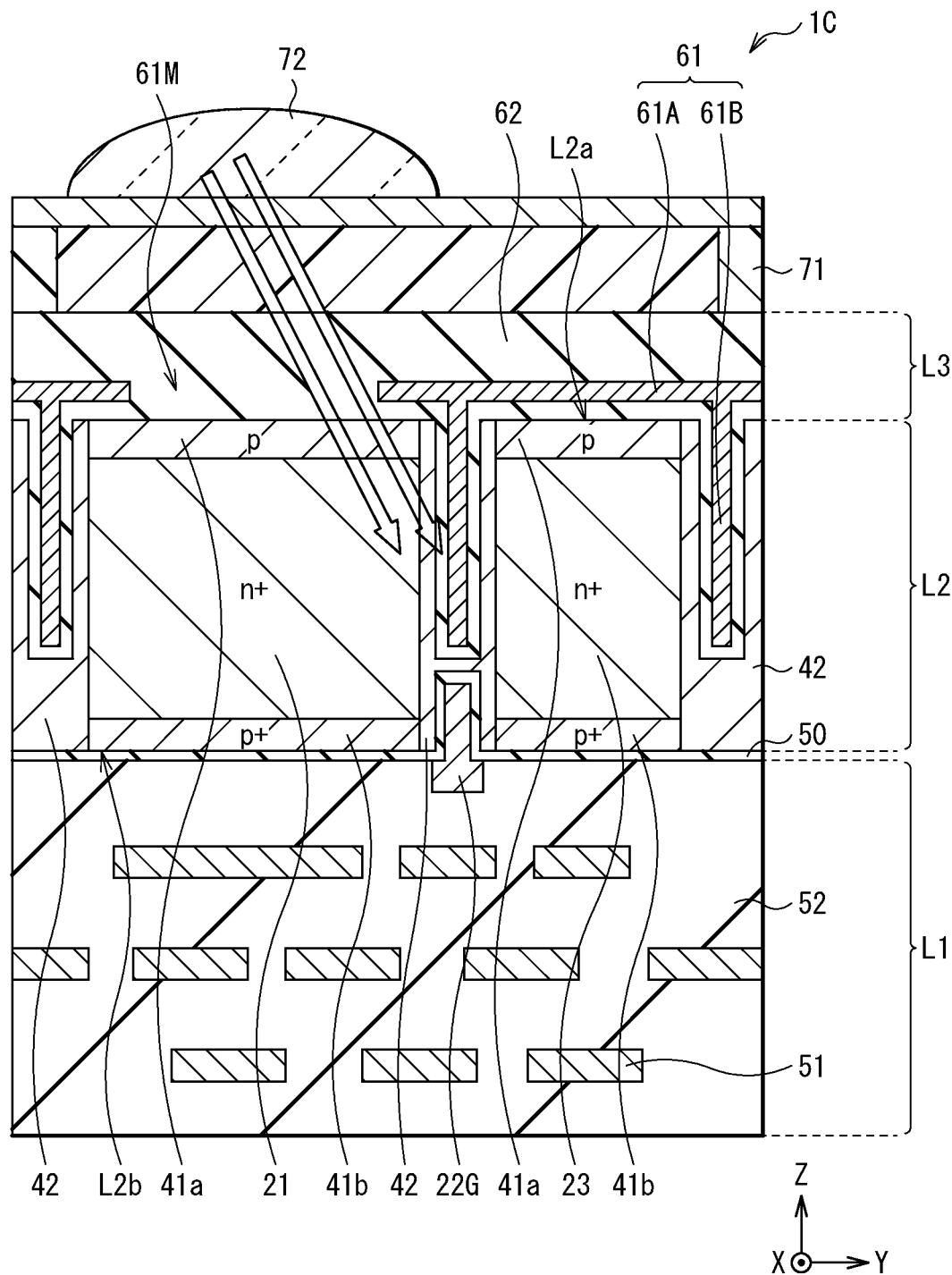

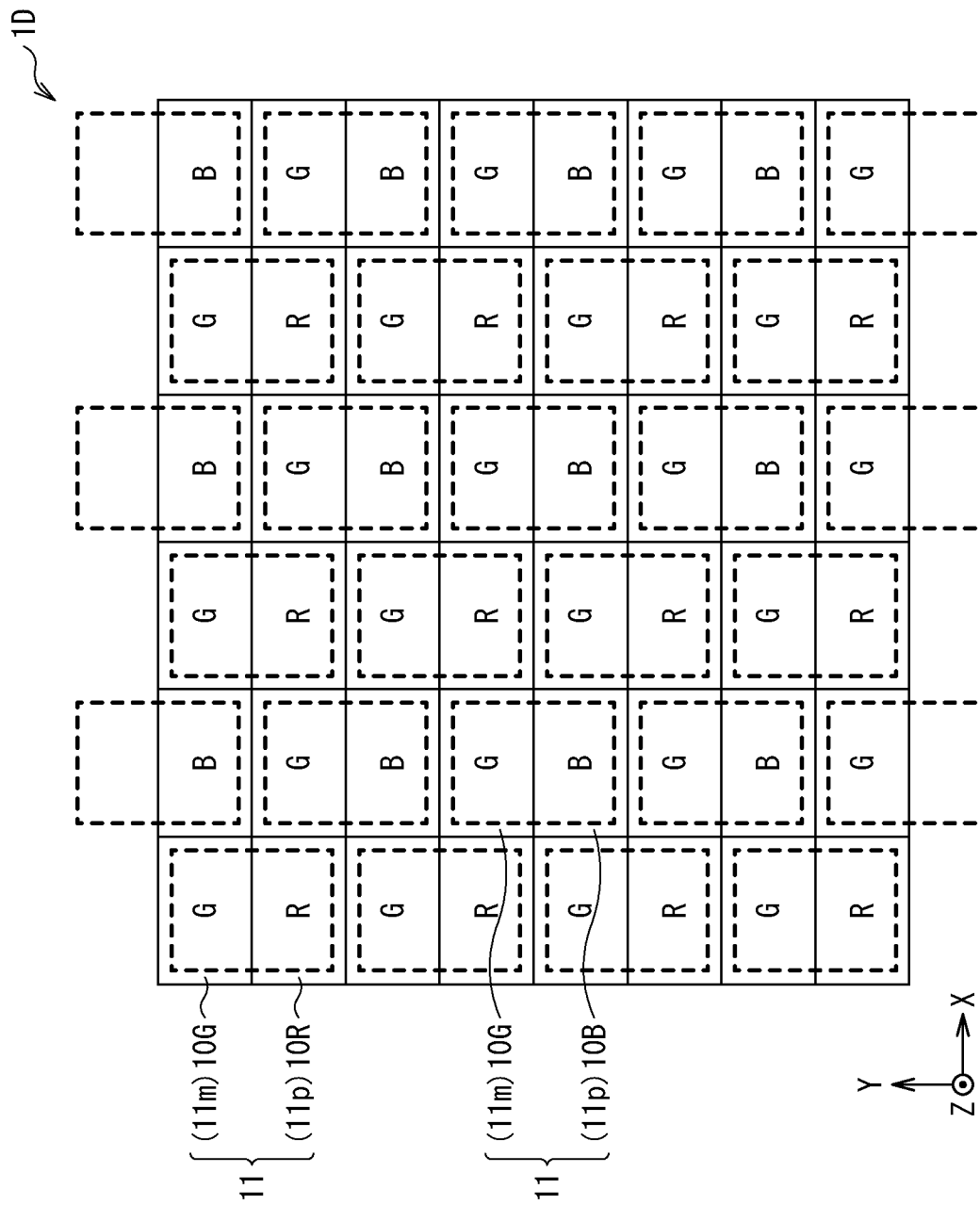
[FIG. 14]

[FIG. 15]
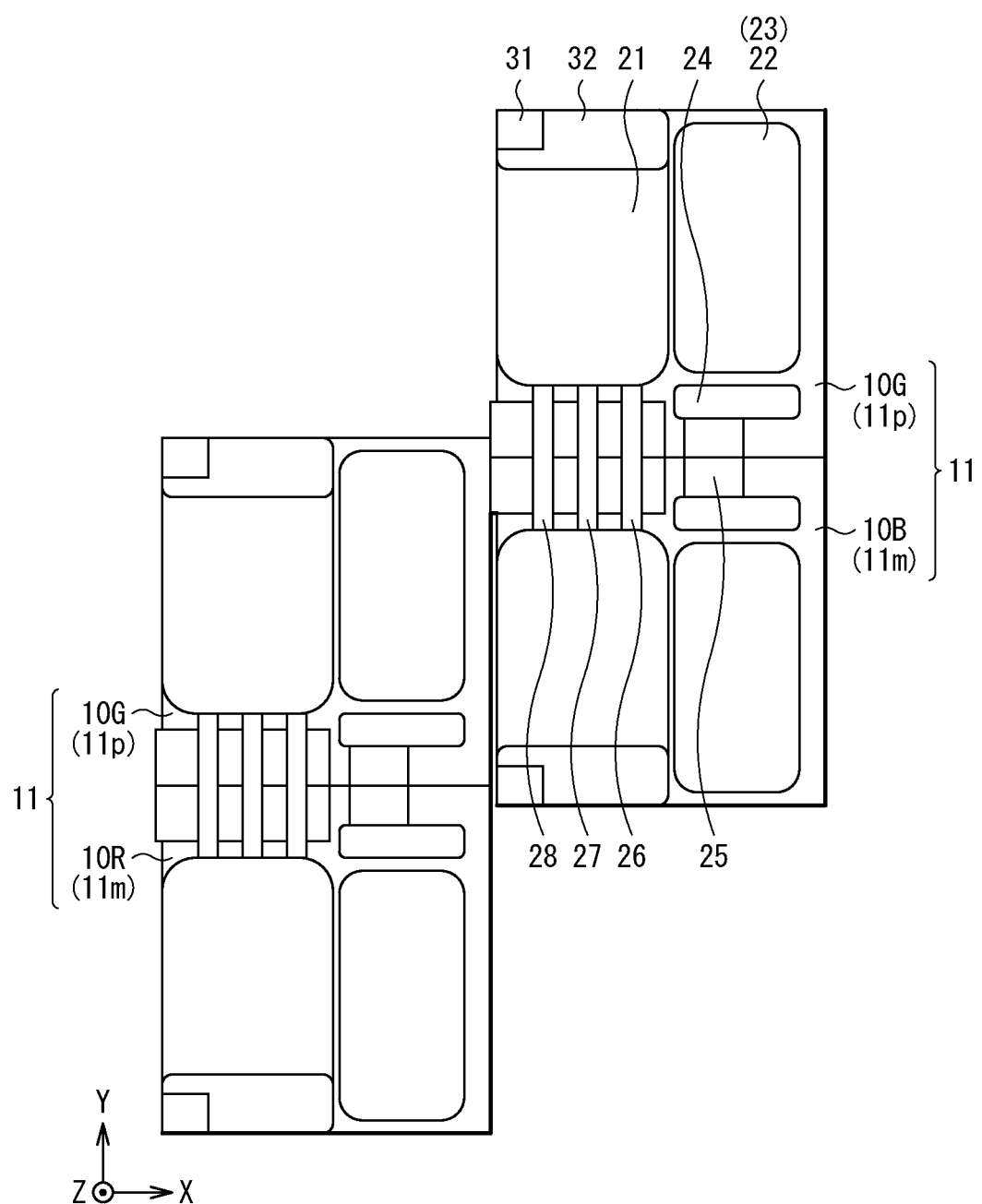

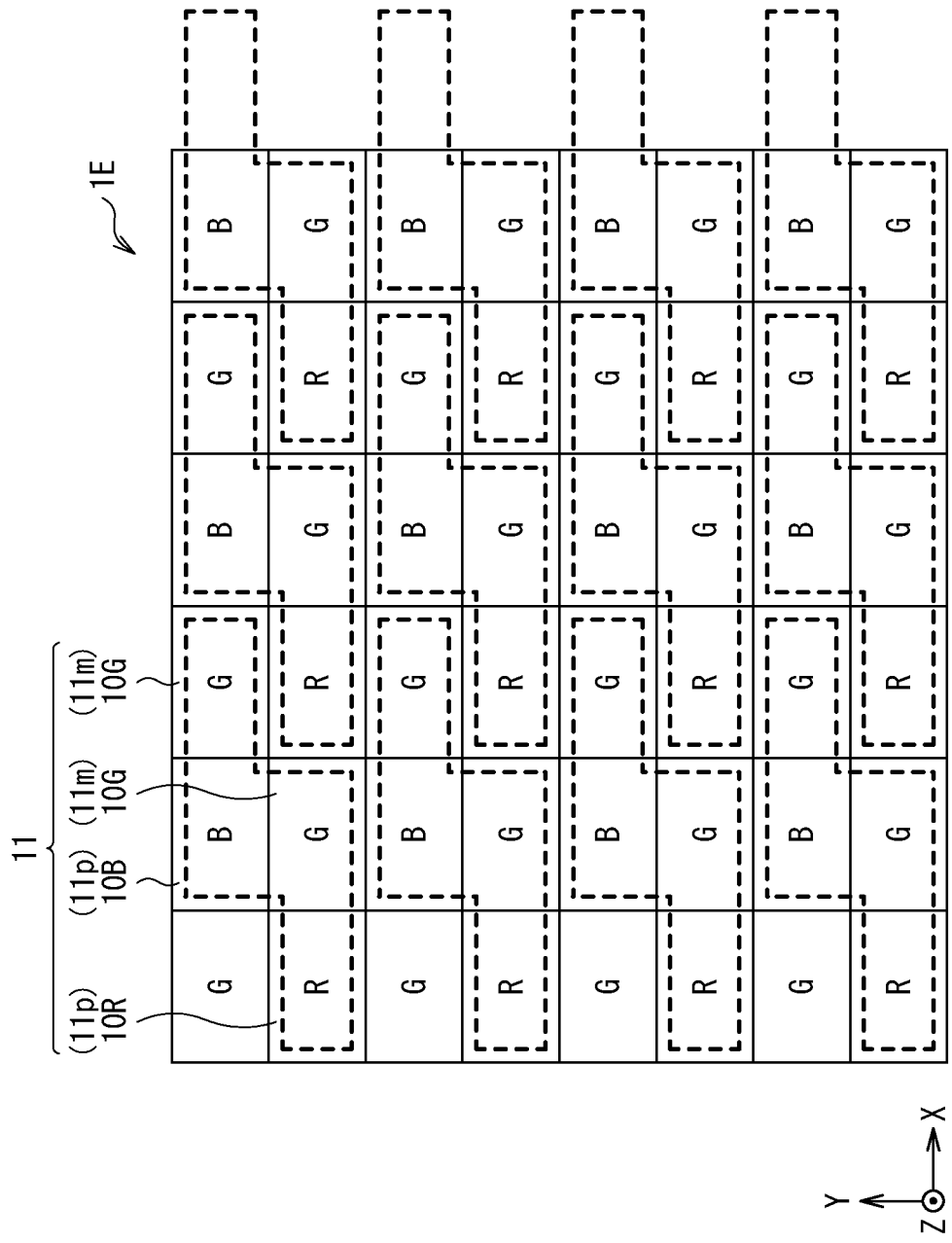
[FIG. 16]

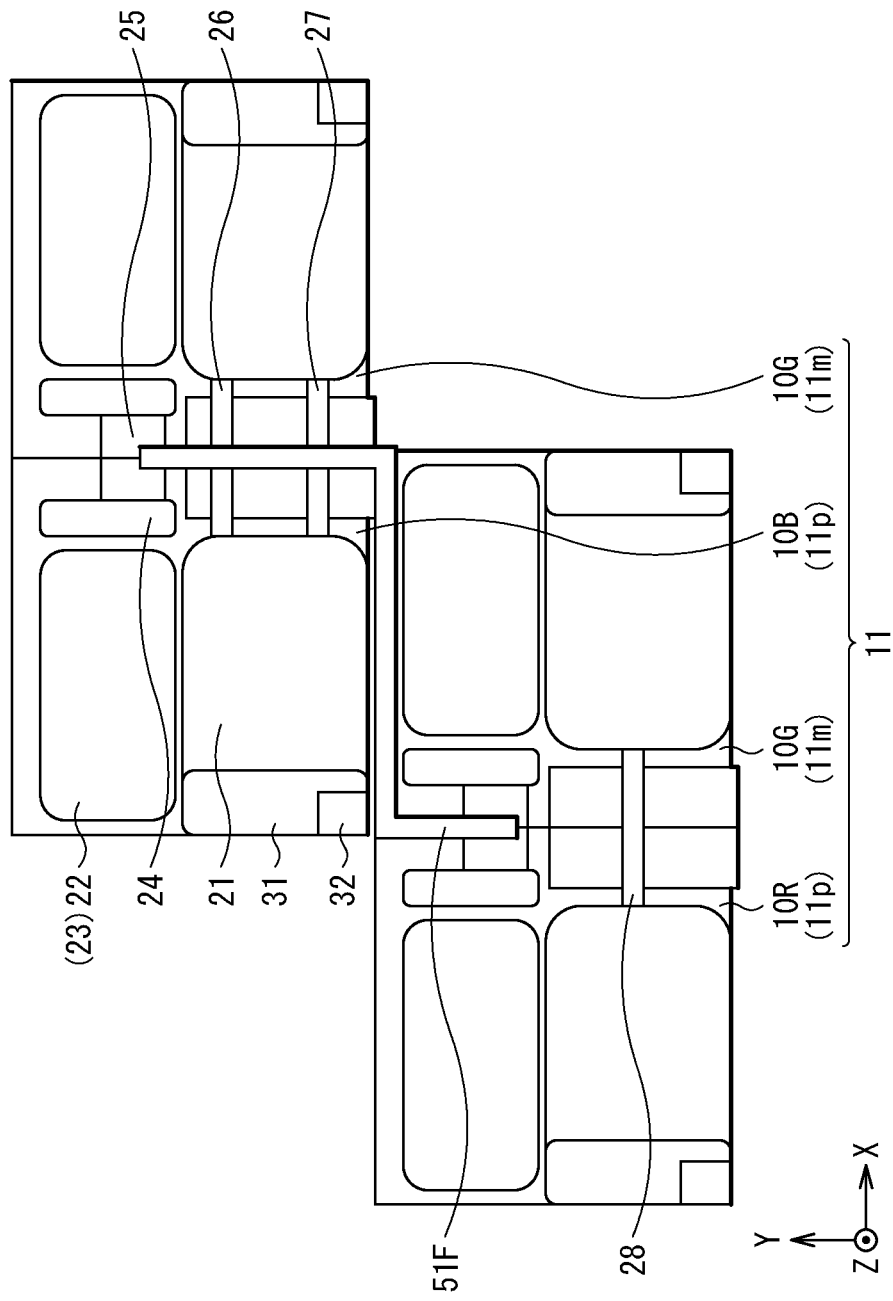

[FIG. 18]
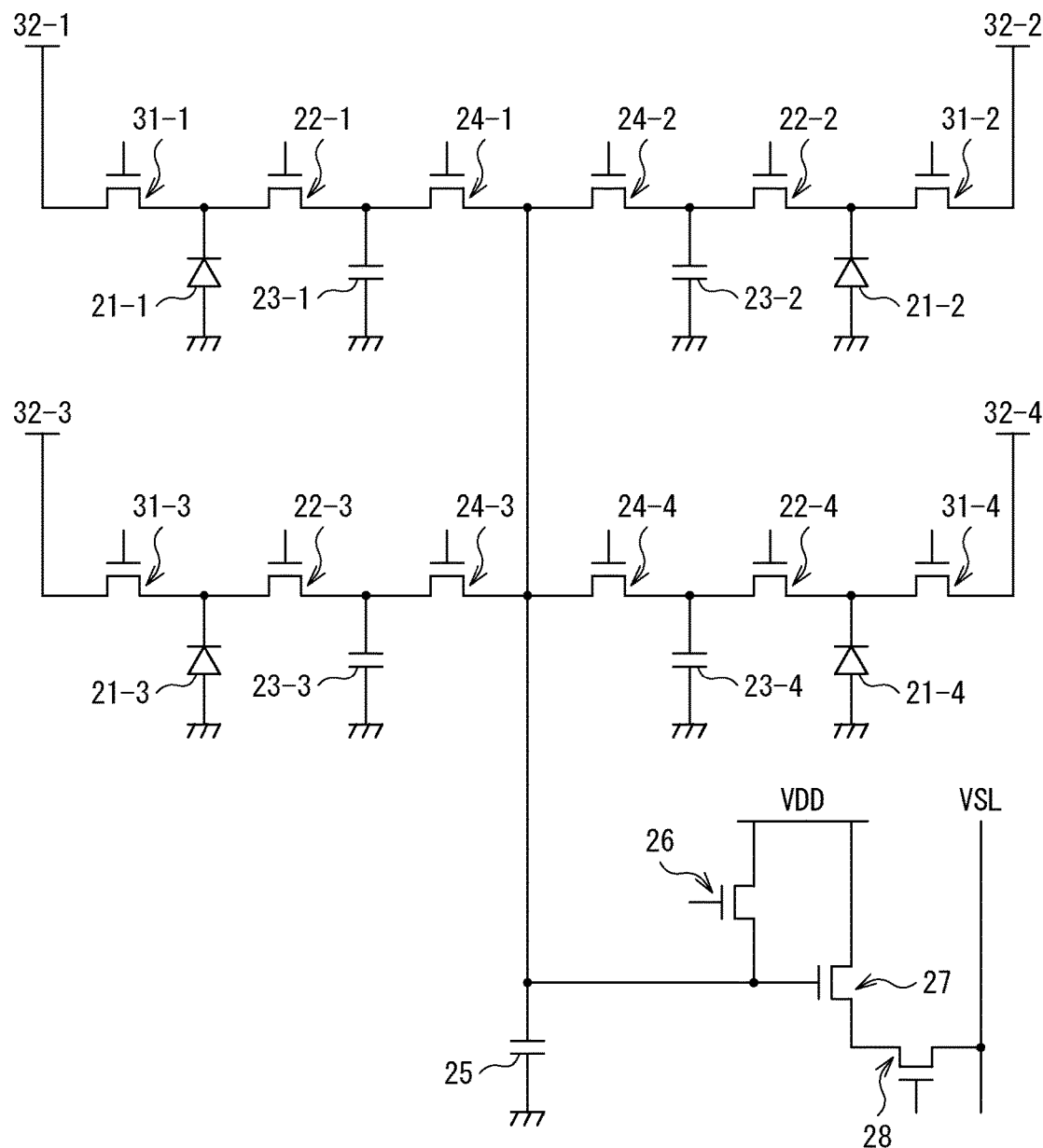

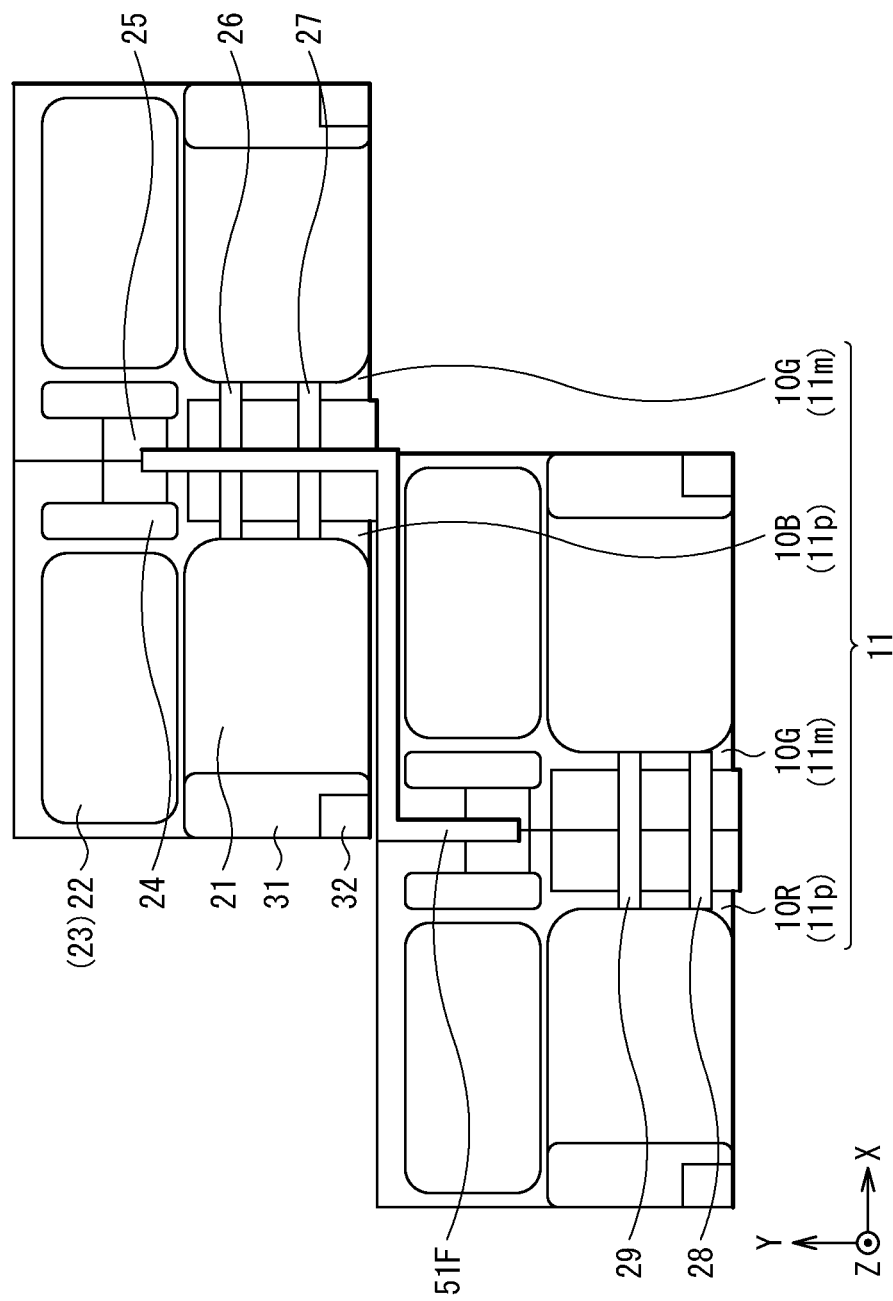
[FIG. 19]

[FIG. 20]
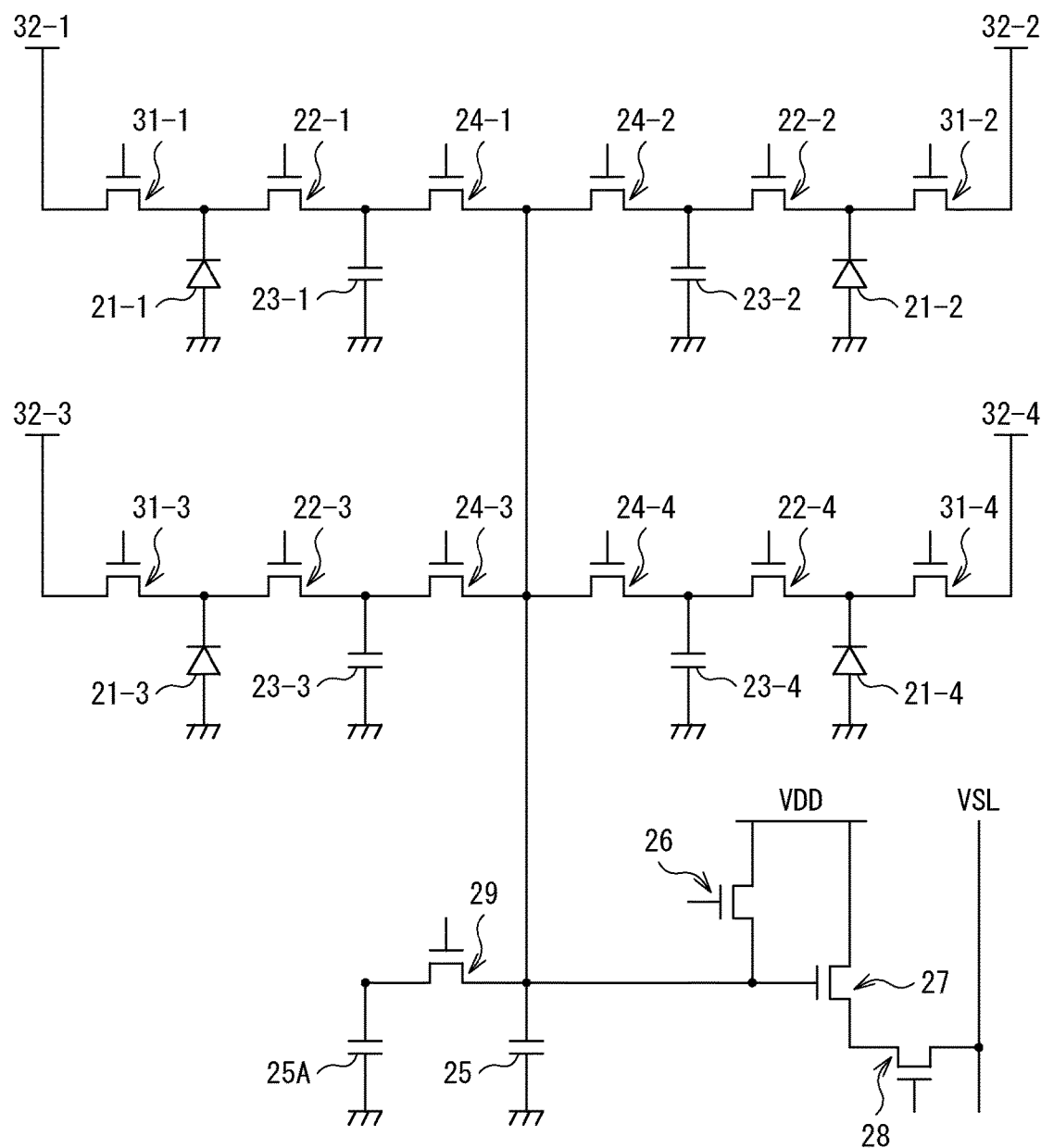

[FIG. 21]
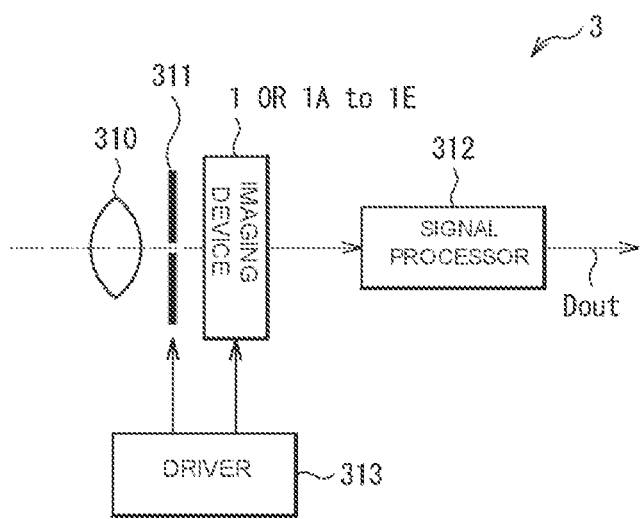

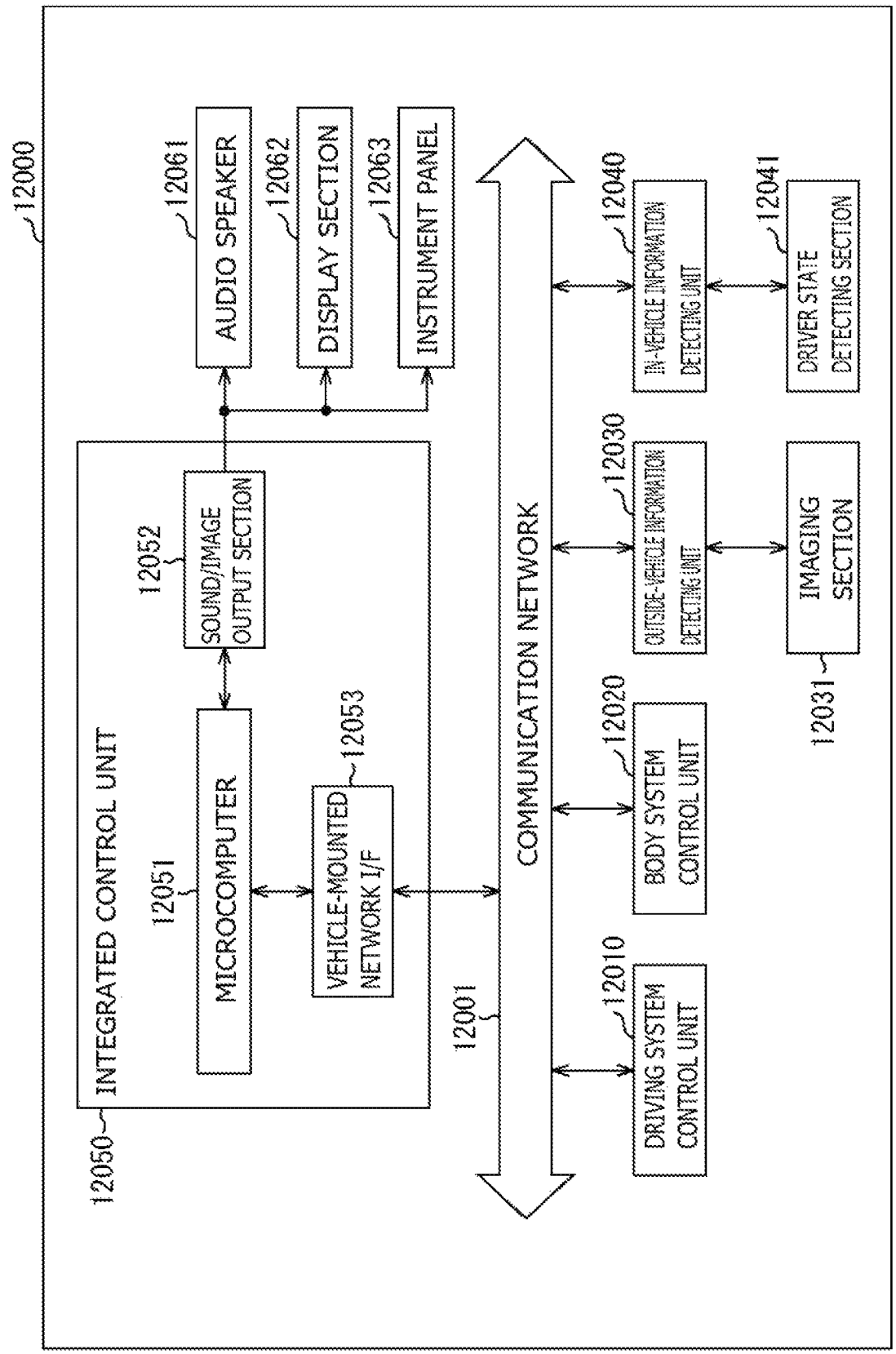
[FIG. 22]

[FIG. 23]
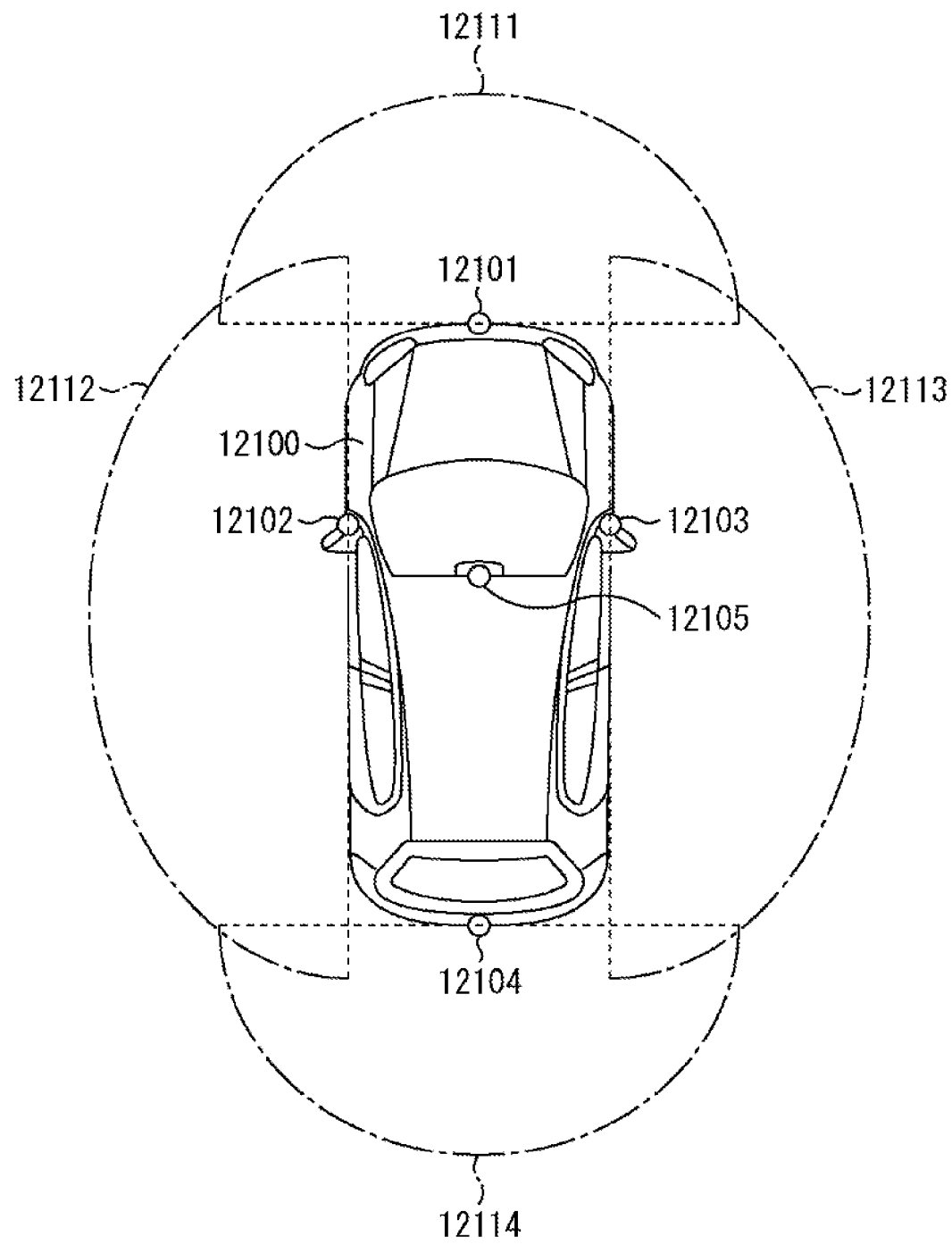

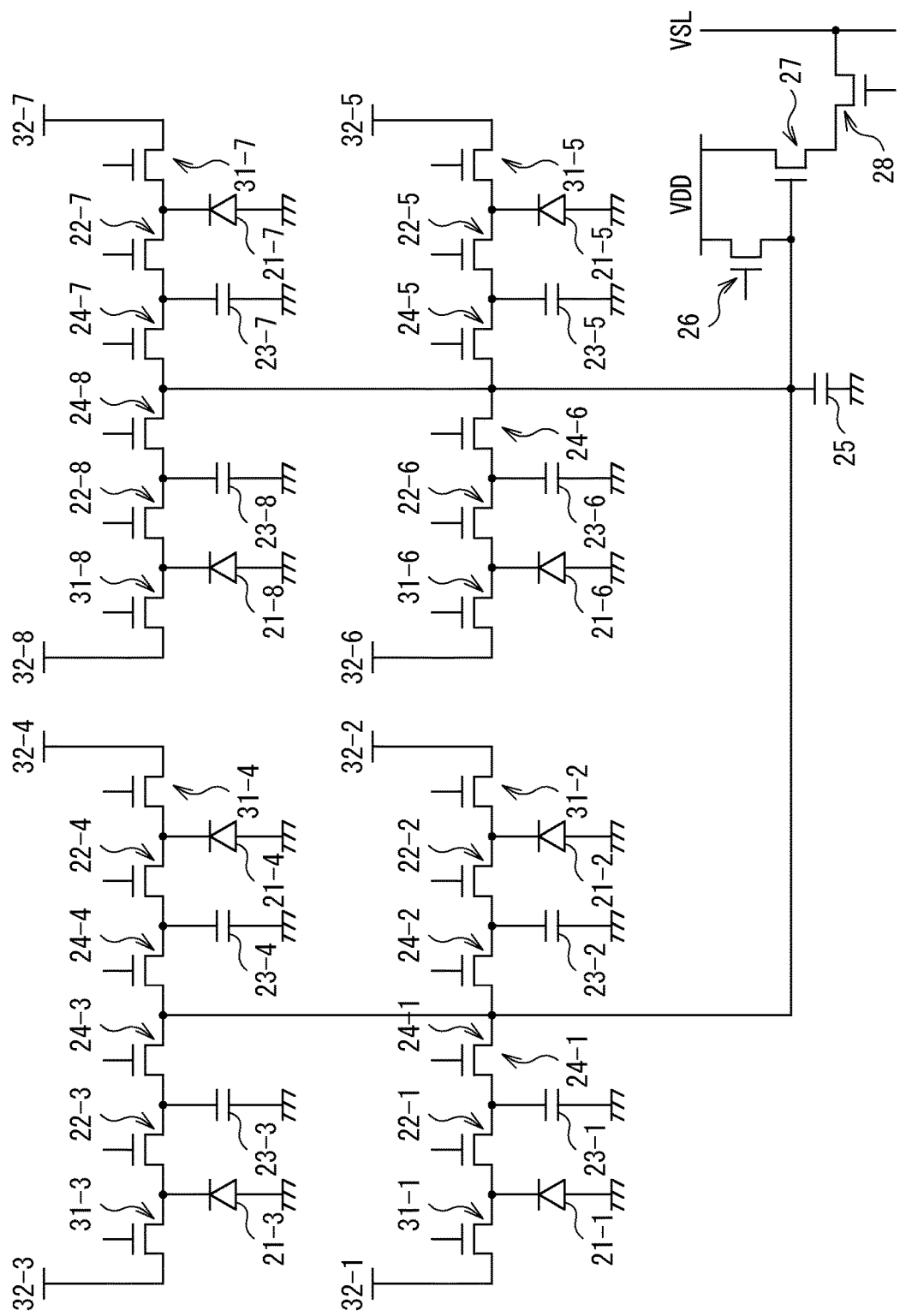
[FIG. 24]

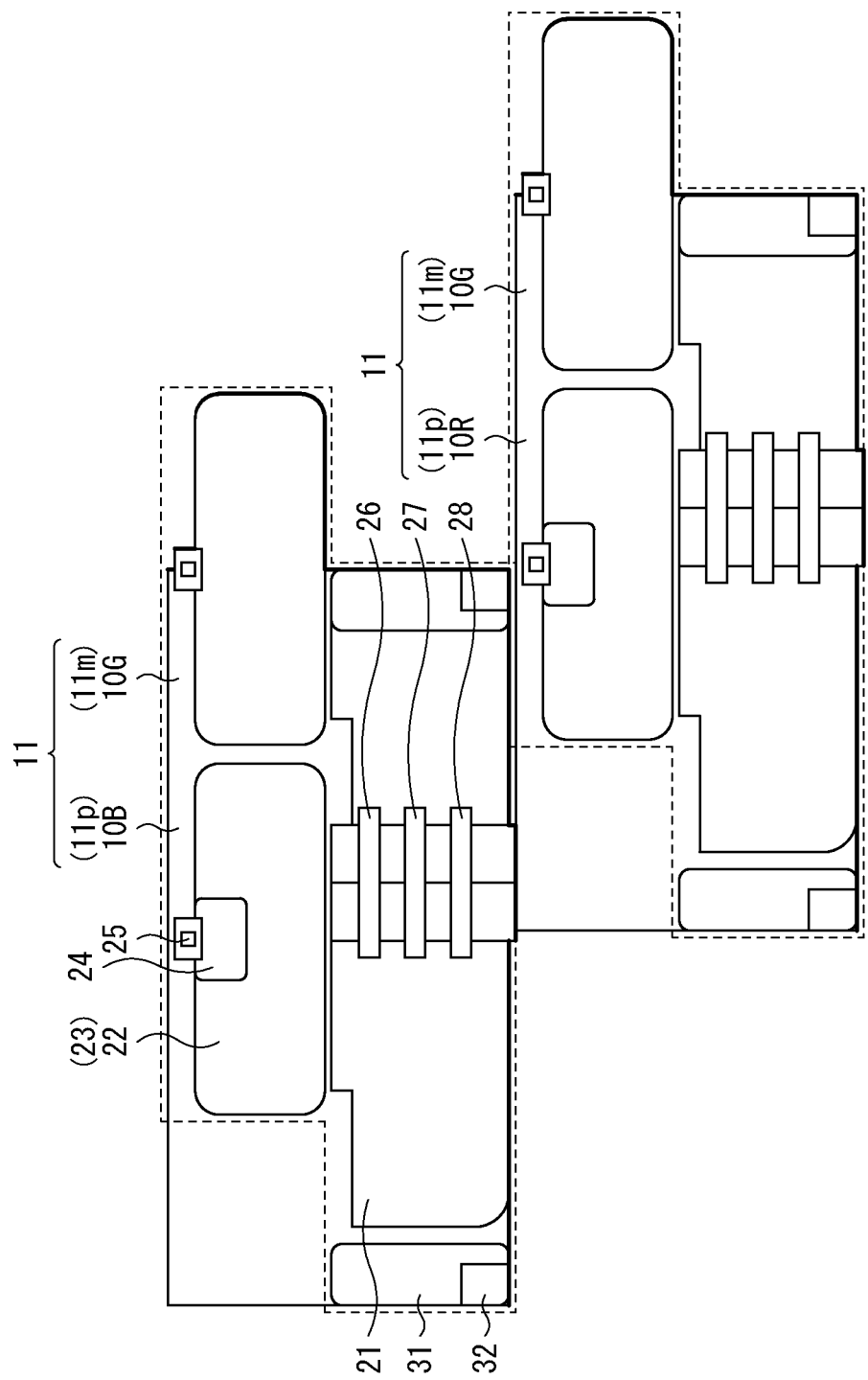
[FIG. 25]

IMAGING DEVICE

CROSS REFERENCE TO RELATED APPLICATIONS

This application is a U.S. National Phase of International Patent Application No. PCT/JP2020/000237 filed on Jan. 8, 2020, which claims priority benefit of Japanese Patent Application No. JP 2019-006285 filed in the Japan Patent Office on Jan. 17, 2019. Each of the above-referenced applications is hereby incorporated herein by reference in its entirety.

TECHNICAL FIELD

The present technology relates to an imaging device having a global shutter function.

BACKGROUND ART

In recent years, a back-illuminated CMOS (Complementary Metal Oxide Semiconductor) image sensor (imaging device) having a global shutter function has attracted attention (see, for example, PTL 1). Such an image sensor includes an electric charge holding unit for each of the pixel regions. Signal charge transferred from a photoelectric converter is temporarily held by this electric charge holding unit.

The imaging device includes, for example, a color filter layer. The color filter layer includes a red filter that selectively transmits light in the red wavelength range, a green filter that selectively transmits light in the green wavelength range, and a blue filter that selectively transmits light in the blue wavelength range. This color filter layer has, for example, Bayer (Bayer) arrangement (see, for example, PTL 2).

CITATION LIST

Patent Literature

PTL 1: Japanese Unexamined Patent Application Publication No. 2015-228510
PTL 2: Japanese Unexamined Patent Application Publication No. 2005-110104

SUMMARY OF THE INVENTION

Such an imaging device is requested to suppress a decrease in image quality.

It is thus desirable to provide an imaging device that is able to suppress a decrease in image quality.

An imaging device according to an embodiment of the present technology includes: an imaging unit in which a plurality of shared sections each including two pixel regions adjacent at least in a first direction is provided and the shared sections provided at closest positions in a second direction are disposed to shift in the first direction by the one pixel region; a photoelectric converter provided for each of the pixel regions; an electric charge holding unit that holds signal charge generated by the photoelectric converter; an electric charge voltage converter to which the signal charge is transferred from the electric charge holding unit; and a pixel transistor that is electrically coupled to the electric charge voltage converter. The second direction intersects the first direction. The pixel transistor is provided for each of the shared sections.

In the imaging device according to the embodiment of the present technology, the shared sections provided at the closest positions in the second direction are disposed to shift in the first direction by the one pixel region. This facilitates the components of the plurality of pixel regions to be aligned that receives light of the same color.

BRIEF DESCRIPTION OF DRAWING

FIG. 1 is a block diagram illustrating an example of a functional configuration of an imaging device according to an embodiment of the present technology.

FIG. 2 is a plane schematic diagram illustrating an example of a configuration of an imaging unit illustrated in FIG. 1.

FIG. 3 is a plane schematic diagram illustrating an example of a configuration of a red pixel region, a green pixel region, and a blue pixel region illustrated in FIG. 1.

FIG. 4 is a diagram illustrating an example of a circuit configuration of each of shared sections illustrated in FIG. 3.

FIG. 5 is a schematic diagram illustrating a cross-sectional configuration taken along a V-V' line illustrated in FIG. 3.

FIG. 6 is a plane schematic diagram illustrating a configuration of a light shielding unit illustrated in FIG. 5.

FIG. 7 is a plane schematic diagram illustrating a configuration of a main portion of an imaging device according to a comparative example.

FIG. 8 is a plane schematic diagram illustrating a configuration of a red pixel region, a green pixel region, and a blue pixel region illustrated in FIG. 7.

FIG. 9 is a plane schematic diagram illustrating a configuration of a main portion of an imaging device according to a modification example 1.

FIG. 10 is a diagram illustrating an example of a circuit configuration of each of shared sections illustrated in FIG. 9.

FIG. 11 is a diagram illustrating another example of the circuit configuration illustrated in FIG. 10.

FIG. 12A is a plane schematic diagram illustrating a configuration of a main portion of an imaging device according to a modification example 2.

FIG. 12B is a schematic diagram illustrating a cross-sectional configuration taken along a B-B' line illustrated in FIG. 12A.

FIG. 13 is a cross-sectional schematic diagram illustrating a configuration of a main portion of an imaging device according to a modification example 3.

FIG. 14 is a plane schematic diagram illustrating a configuration of a main portion of an imaging device according to a modification example 4.

FIG. 15 is a plane schematic diagram illustrating an example of a configuration of a red pixel region, a green pixel region, and a blue pixel region illustrated in FIG. 14.

FIG. 16 is a plane schematic diagram illustrating a configuration of a main portion of an imaging device according to a modification example 5.

FIG. 17 is a plane schematic diagram illustrating an example of a configuration of a red pixel region, a green pixel region, and a blue pixel region illustrated in FIG. 16.

FIG. 18 is a diagram illustrating an example of a circuit configuration of a shared section illustrated in FIG. 17.

FIG. 19 is a schematic diagram illustrating another example of a planar configuration of the shared section illustrated in FIG. 17.

FIG. 20 is a diagram illustrating an example of a circuit configuration of a shared section illustrated in FIG. 19.

FIG. 21 is a functional block diagram illustrating an example of an electronic apparatus (camera) including the imaging device illustrated in FIG. 1 or the like.

FIG. 22 is a block diagram depicting an example of schematic configuration of a vehicle control system.

FIG. 23 is a diagram of assistance in explaining an example of installation positions of an outside-vehicle information detecting section and an imaging section.

FIG. 24 is a diagram illustrating another example of the circuit configuration of the shared section illustrated in FIG. 18 or the like.

FIG. 25 is a plane schematic diagram illustrating another example of a planar configuration of the red pixel region, the green pixel region, and the blue pixel region illustrated in FIG. 3 or the like.

MODES FOR CARRYING OUT THE INVENTION

The following describes an embodiment of the present technology in detail with reference to the drawings. It is to be noted that description is given in the following order.
1. Embodiment (Example of an imaging device including a shared section that includes two pixel regions adjacent in the X direction)
2. Modification Example 1 (Example in which an FD transistor is included)
3. Modification Example 2 (Example in which a light shielding unit has a penetration region)
4. Modification Example 3 (Example in which an embedded gate electrode is included)
5. Modification Example 4 (Example in which a shared section is included that includes two pixel regions adjacent in the Y direction)
6. Modification Example 5 (Example in which a shared section is included that includes four pixel regions)
7. Application Example
8. Practical Application Example

Embodiment

[Configuration of Imaging Device 1]

FIG. 1 is a block diagram illustrating a functional configuration example of an imaging device 1 according to an embodiment of the present technology.

The imaging device 1 is a back-illuminated image sensor having a global shutter system. The image sensor having the global shutter system includes, for example, a CMOS image sensor and the like. The imaging device 1 captures an image by receiving light from a subject and photoelectrically converting the received light to generate an image signal. It is to be noted that the present technology is not limited to the application to the CMOS image sensor. This imaging device 1 may have a structure in which a plurality of semiconductor chips is stacked or may include a single semiconductor chip.

The global shutter system is a system that performs global exposure in which exposure is started basically at the same time for all the pixels and finished at the same time for all the pixels. Here, all the pixels refer to all the pixels in the portion appearing in an image and exclude dummy pixels or the like. In addition, in a case where a time difference or a distortion of an image is small enough to cause no problem, the global shutter system also includes a system that shifts regions where to perform global exposure while performing global exposure in units of a plurality of rows (e.g., several tens of rows) rather than performing exposure at the same time for all the pixels. In addition, the global shutter system also includes a system that performs global exposure for the pixels in a predetermined region rather than on all the pixels in the portion appearing in an image.

The imaging device 1 includes an imaging unit 111, a vertical driver 112, a ramp wave module 113, a clock module 114, a data storage unit 115, a horizontal driver 116, a system controller 117, and a signal processor 118.

FIG. 2 schematically illustrates a planar configuration of the imaging unit 111. The imaging unit 111 is provided in the middle portion of the imaging device 1 (FIG. 1). The planar shape of the imaging unit 111 (shape in the XY plane) is, for example, rectangular. This imaging unit 111 includes a plurality of pixel regions (red pixel regions 10R, green pixel regions 10G, and blue pixel regions 10B), for example, disposed in the shape of a matrix (in a matrix). Each of the red pixel regions 10R receives light in the red wavelength range, each of the green pixel regions 10G receives light in the green wavelength range, and each of the blue pixel regions 10B receives light in the blue wavelength range. The red pixel regions 10R, the green pixel regions 10G, and the blue pixel regions 10B are disposed in accordance with the Bayer arrangement of the color filter layer (color filter layer 71 in FIG. 3B described below). In other words, the two green pixel regions 10G, the one red pixel region 10R, and the one blue pixel region 10B serve as a repeating unit and this repeating unit is periodically disposed. The green pixel regions 10G are provided to line up in the diagonal directions. For example, in the imaging unit 111, a pixel drive line (not illustrated) is provided along the row direction for each of the pixel rows (pixel regions that line up in the X axis direction) including pixel regions arranged in the row direction and a vertical signal line (vertical signal line VSL in FIG. 4 described below) is provided along the column direction for each of the pixel columns (pixel regions that line up in the Y axis direction) including pixel regions arranged in the column direction. Here, the green pixel region 10G corresponds to a specific example of a first pixel region according to the present disclosure and the red pixel region 10R and the green pixel region 10G each correspond to a specific example of a second pixel region according to the present disclosure.

The imaging unit 111 includes a plurality of shared sections 11 each including two pixel regions (the blue pixel region 10B and the green pixel region 10G or the red pixel region 10R and the green pixel region 10G) adjacent in the X axis direction. A specific configuration of the shared section 11 is described below. The X axis direction corresponds to a first direction according the present disclosure and the Y axis direction corresponds to a second direction according to the present disclosure.

The vertical driver 112 includes, for example, a shift register, an address decoder, and the like. This vertical driver 112 drives all the pixels of the imaging unit 111 at the same time or drives, for example, the pixels in units of rows by supplying signals or the like to the respective pixels via the plurality of pixel drive lines.

The ramp wave module 113 generates a ramp wave signal that is used for A/D (Analog/Digital) conversion for a pixel signal and supplies the generated ramp wave signal to a column processor (not illustrated). It is to be noted that the column processor includes, for example, a shift register, an address decoder, and the like. The column processor performs a noise removal process, a correlation double sampling process, an A/D conversion process, and the like and generates a pixel signal. The column processor supplies the generated pixel signal to the signal processor 118.

The clock module 114 supplies each unit of the imaging device 1 with a clock signal for an operation.

The horizontal driver 116 selects unit circuits corresponding to the pixel columns of the column processor in order. The selective scanning by this horizontal driver 116 causes the pixel signals subjected to signal processing by the column processor for each unit circuit to be outputted to the signal processor 118 in order.

The system controller 117 includes a timing generator and the like. The timing generator generates a variety of timing signals. The system controller 117 controls the driving of the vertical driver 112, the ramp wave module 113, the clock module 114, the horizontal driver 116, and the column processor on the basis of timing signals generated by the timing generator.

While temporarily storing data in the data storage unit 115 as necessary, the signal processor 118 performs signal processing such as arithmetic processing on a pixel signal supplied from the column processor and outputs an image signal including each pixel signal.

Next, a specific configuration of the shared section 11 is described.

FIG. 3 illustrates a planar configuration of the two shared sections 11 disposed at the closest positions in the Y axis direction. The imaging unit 111 has a pixel row in which the blue pixel regions 10B and the green pixel regions 10G are alternately provided and a pixel row in which the red pixel regions 10R and the green pixel regions 10G are alternately provided (FIG. 2). In the imaging unit 111, these two types of pixel rows are alternately disposed. In other words, the imaging unit 111 includes the shared section 11 including the blue pixel region 10B and the green pixel region 10G and the shared section 11 including the red pixel region 10R and the green pixel region 10G. The imaging unit 111 is alternately provided with these two types of shared sections 11 along the Y axis direction.

The red pixel region 10R, the green pixel region 10G, and the blue pixel region 10B each include a photodiode (PD) 21, a first transfer transistor (TRX) 22, an electric charge holding unit (MEM) 23, a second transfer transistor (TRG) 24, an overflow gate (OFG) 31, and an overflow drain (OFD) 32. The TRX 22 and the MEM 23 are provided at positions at which the TRX 22 and the MEM 23 overlap with each other in a plan (XY plane) view. The PD 21 and the MEM 23 are disposed to line up in the Y axis direction (the direction orthogonal to the direction in which the two pixel regions line up that are included in the shared section 11). Here, the PD 21 corresponds to a specific example of a photoelectric converter according to the present disclosure.

Each of the shared sections 11 includes a floating diffusion (FD) 25, a reset transistor (RST) 26, an amplification transistor (AMP) 27, and a selection transistor (SEL) 28. In other words, the FD 25, the RST 26, the AMP 27, and the SEL 28 are disposed for each of the shared sections 11. In this way, two pixel regions (the blue pixel region 10B and the green pixel region 10G or the red pixel region 10R and the green pixel region 10G) share the FD 25, the RST 26, the AMP 27, and the SEL 28, thereby facilitating the regions of the PDs 21 and the MEMs 23 to be more effectively used. Here, the FD 25 corresponds to a specific example of an electric charge voltage converter according to the present disclosure and the RST 26, the AMP 27, and the SEL 28 each correspond to a specific example of a pixel transistor according to the present disclosure.

FIG. 4 illustrates an example of a configuration of a pixel circuit of the imaging device 1. In one (e.g., blue pixel region 10B) of the pixel regions included in the shared section 11, there is provided TRX 22-1 between PD 21-1 and MEM 23-1 and TRG 24-1 is coupled to the MEM 23-1. In the other (e.g., green pixel region 10G) of the pixel regions included in the shared section 11, there is provided TRX 22-2 between PD 21-2 and MEM 23-2 and TRG 24-2 is coupled to the MEM 23-2. The TRGs 24-1 and 24-2 are coupled to the FD 25. The RST 26 is coupled to this FD 25 along with the TRGs 24-1 and 24-2. In addition, the FD 25 is coupled to the vertical signal line VSL via the AMP 27 and the SEL 28. OFDs 32-1 and 32-2 are coupled to the PD 21-1 and the PD 21-2 via OFGs 31-1 and 31-2 along with the TRXs 22-1 and 22-2.

In the PD 21 (21-1 or 21-2) provided for each of the red pixel regions 10R, each of the green pixel regions 10G, or each of the blue pixel regions 10B, light from a subject is received and photoelectrically converted. The PD 21 generates signal charge corresponding to the amount of received light and accumulates the generated signal charge.

One of the paired source and drain electrodes of the TRX 22 (22-1 or 22-2) is coupled to the PD 21 and the other is coupled to the MEM 23. The TRX 22 is turned on in a case where a first transfer signal is inputted to the gate thereof. This causes the signal charge generated by the PD 21 to be read out and transferred to the MEM 23.

The MEM 23 (23-1 or 23-2) is coupled to the TRX 22 and the TRG 24 (24-1 or 24-2). This MEM 23 is an electric charge holding unit for temporarily holding the signal charge generated by the PD 21. This MEM 23 is provided to the imaging device 1 and a global shutter function is thus achieved.

One of the paired source and drain electrodes of the TRG 24 is coupled to the MEM 23 and the other is coupled to the FD 25. The TRG 24 is turned on in a case where a second transfer signal is inputted to the gate thereof. This causes the signal charge temporarily held by the MEM 23 to be read out and transferred to the FD 25.

The TRG 24, the RST 26, and the AMP 27 are coupled to the FD 25. This FD 25 holds the signal charge read out from the MEM 23 and converts the signal charge into a voltage (potential).

The RST 26 is provided between the supply terminal of a constant voltage source VDD and the FD 25. The RST 26 is turned on in a case where a reset signal is inputted to the gate thereof. This causes the electric charge accumulated in the FD 25 to be discharged to the constant voltage source VDD and causes the potential of the FD 25 to be reset.

The AMP 27 has the gate coupled to the FD 25, one of the paired source and drain electrodes coupled to the supply terminal of the constant voltage source VDD, and the other coupled to the vertical signal line VSL via the SEL 28. This AMP 27 amplifies the potential of the FD 25 and outputs the amplification signal to the SEL 28 as a pixel signal.

The SEL 28 is provided between the AMP 27 and the vertical signal line VSL. The SEL 28 is turned on in a case where an address signal is inputted to the gate thereof. This causes the pixel signal amplified by the AMP 27 to be controlled and outputted to the vertical signal line VSL.

The OFG 31 (31-1 or 31-2) is provided between the OFD 32 (32-1 or 32-2) and the PD 21. The OFG 31 is turned on in a case where a discharge signal is inputted to the gate thereof. This causes the unnecessary electric charge accumulated in the PD 21 to be discharged to the OFG 31.

FIG. 5 schematically illustrates a cross-sectional configuration of a main portion of the imaging unit 111. FIG. 5 corresponds to the cross-sectional configuration taken along a V-V' line illustrated in FIG. 3.

The imaging device 1 includes a multilayer wiring layer L1 and a semiconductor substrate L2 stacked on the multilayer wiring layer L1. The semiconductor substrate L2 has a first surface L2a and a second surface L2b opposed to each other. The multilayer wiring layer L1 is provided on the second surface L2b of the semiconductor substrate L2 with an insulating film 50 interposed in between. The first surface L2a is included in a light receiving surface. This imaging device 1 is a back-illuminated imaging device.

The TRX 22 and the TRG 24 are provided near the second surface L2b of the semiconductor substrate L2. The RST 26, the AMP 27, and the SEL 28 (FIG. 3) may be provided near the second surface L2b of the semiconductor substrate L2. For example, a light shielding layer L3, a color filter layer 71, and an on-chip lens 72 are provided in this order on the first surface L2a of the semiconductor substrate L2. The PD 21, the MEM 23, and the FD 25 (not illustrated in FIG. 5) are provided in the semiconductor substrate L2. The color filter layer 71 is opposed to the multilayer wiring layer L1 with the semiconductor substrate L2 interposed in between.

The multilayer wiring layer L1 is supported, for example, by a support substrate (not illustrated). The support substrate and the semiconductor substrate L2 are opposed to each other with the multilayer wiring layer L1 interposed in between. The multilayer wiring layer L1 includes a plurality of wiring lines 51 electrically coupled to the PD 21 and an interlayer insulating film 52 for separating the plurality of these wiring lines 51 from each other. The plurality of wiring lines 51 is, for example, for reading out signal charge generated, for example, by the PD 21. The multilayer wiring layer L1 is provided with a circuit for driving, for example, the red pixel region 10R, the green pixel region 10G, or the blue pixel region 10B. For example, the multilayer wiring layer L1 is provided with a gate electrode 22G of the TRX 22 on the semiconductor substrate L2 side. The gate electrode 22G is disposed at a position at which the gate electrode 22G overlaps, for example, with the MEM 23 in a plan view.

The insulating film 50 provided between the multilayer wiring layer L1 and the semiconductor substrate L2 is for insulating the second surface L2b of the semiconductor substrate L2. The insulating film 50 includes, for example, an oxide film such as a silicon oxide film (SiO).

The semiconductor substrate L2 includes, for example, silicon (Si). The PD 21 is widely provided in the thickness direction of the semiconductor substrate L2. This PD 21 has, for example, an n-type impurity region. The MEM 23 is provided at the position adjacent to the PD 21 in the Y axis direction. This MEM 23 has, for example, an n-type impurity region. The MEM 23 is provided at a position opposed to the gate electrode 22G of the multilayer wiring layer L1. The MEM 23 is electrically coupled to the PD 21 and there is provided a transfer path of the signal charge from the PD 21 to the MEM 23 in the semiconductor substrate L2. There is provided a p-type impurity region 41a between the PD 21 and the MEM 23 and the first surface L2a and there is provided a p-type impurity region 41b between the PD 21 and the MEM 23 and the second surface L2b. The FD 25 is, for example, an n-type impurity region and is provided at a position close to the second surface L2b in the semiconductor substrate L2. The FD 25 is provided, for example, across the two pixel regions included in each of shared sections 11 (FIG. 3). For example, the FD 25 is disposed in the middle portion of each of the shared sections 11. The PD 21 (21-1 or 21-2) and the MEM 23 (23-1 or 23-2) are disposed outside each of the shared sections 11.

There is provided a groove formation region 42 on the semiconductor substrate L2. This groove formation region 42 is a region provided with a groove having a predetermined size in the thickness direction (Z axis direction) of the semiconductor substrate L2. For example, the groove formation region 42 is provided with a groove having such a size that the semiconductor substrate L2 is not penetrated. The groove formation region 42 is provided, for example, between the PD 21 and the MEM 23 of each of the red pixel region 10R, the green pixel region 10G, and the blue pixel region 10B. The groove formation region 42 may be provided to surround the PD 21 in a plan view.

The light shielding layer L3 provided on the first surface L2a of the semiconductor substrate L2 includes a light shielding unit 61 and an insulating film 62 that covers the light shielding unit 61. The light shielding unit 61 includes a light shielding section 61A provided to cover the first surface L2a of the semiconductor substrate L2 and a light shielding section 61B with which the groove of the groove formation region 42 is filled. The light shielding section 61A is provided substantially parallel to the first surface L2a and the light shielding section 61B is provided substantially vertical to the first surface L2a. Here, the light shielding section 61B corresponds to a specific example of a first light shielding section according to the present disclosure and the light shielding section 61A corresponds to a specific example of a second light shielding section according to the present disclosure.

FIG. 6 illustrates an example of the planar shape of the light shielding section 61A. The light shielding section 61A has an opening 61M in a region opposed to the PD 21. The opening 61M has, for example, a rectangular planar shape. For example, the long sides of this opening 61M are provided in the X axis direction and the short sides are provided in the Y axis direction. For example, the direction of the long sides of the imaging unit 111 having a rectangular planar shape is the X axis direction. It is preferable that the direction of the long sides of the imaging unit 111 and the direction of the long sides of the opening 61M be substantially parallel to each other. This makes it possible to secure the grazing incidence characteristic in the image height direction. The planar shape of the opening 61M may be square or the like. The light shielding section 61A covers the MEM 23, the FD 25, and the like.

As with the groove formation region 42, the light shielding section 61B is provided between the PD 21 and the MEM 23 of each of the red pixel region 10R, the green pixel region 10G, and the blue pixel region 10B. The light shielding section 61B may be provided to surround the PD 21 in a plan view. In this way, providing the light shielding section 61B embedded in the semiconductor substrate L2 suppresses the leakage of light entering the PD 21 from the oblique direction into the MEM 23. This makes it possible to suppress the generation of optical noise caused by the leakage of light into the MEM 23. The groove of the groove formation region 42 is filled with the insulating film 62 and the light shielding section 61B in this order.

The light shielding unit 61 includes, for example, tungsten (W), aluminum (Al), copper (Cu), or the like. The light shielding unit 61 is coupled to the ground potential (GND). The insulating film 62 includes, for example, silicon oxide (SiO2), hafnium oxide (HfO2), tantalum pentoxide (Ta2O5), zirconium dioxide (ZrO2), or the like.

The color filter layer 71 covers the first surface L2a of the semiconductor substrate L2 with the light shielding layer L3 in between. This color filter layer 71 includes, for example, a red (R) filter that selectively transmits light in the red wavelength range, a green (G) filter that selectively transmits light in the green wavelength range, and a blue (B) filter that selectively transmits light in the blue wavelength range. For example, the red pixel region 10R is provided with a red filter, the green pixel region 10G is provided with a green filter, and the blue pixel region 10B is provided with a blue filter. These red filter, green filter, and blue filter are provided in regular color arrangement (e.g., Bayer arrangement). Providing the color filter layer 71 like this allows the imaging device 1 to obtain the pieces of light reception data of colors corresponding to the color arrangement.

The on-chip lenses 72 on the color filter layer 71 are provided at positions opposed to the respective PDs 21 of the red pixel region 10R, the green pixel region 10G, and the blue pixel region 10B. Light entering this on-chip lens 72 is condensed on the PD 21 for each of the red pixel regions 10R, each of the green pixel regions 10G, or each of the blue pixel regions 10B. The lens system of this on-chip lens 72 is set at a value corresponding to the size of the pixel region. Examples of a lens material of the on-chip lens 72 include an organic material, a silicon oxide film (SiO), and the like.

In the imaging device 1 having such a configuration, one and the other of the two pixel regions included in the shared section 11 have a substantially mirror image relationship (FIG. 3). The configuration of the light shielding layer L3, the semiconductor substrate L2, and the multilayer wiring layer L1 is different between one and the other of the two pixel regions included in the shared section 11. In other words, the optical characteristics of the light shielding layer L3, the semiconductor substrate L2, and the multilayer wiring layer L1 are different between one and the other of the two pixel regions included in the shared section 11. For example, the light shielding layer L3, the semiconductor substrate L2, and the multilayer wiring layer L1 in the pixel region (e.g., the blue pixel region 10B or the red pixel region 10R in FIG. 3) disposed in one (left part of FIG. 3) of the portions of the shared section 11 each have a first optical characteristic 11$p$. The light shielding layer L3, the semiconductor substrate L2, and the multilayer wiring layer L1 in the pixel region (e.g., the green pixel region 10G in FIG. 3) disposed in the other of the portions of the shared section 11 each have a second optical characteristic 11$m$. The second optical characteristic 11$m$ is different from the first optical characteristic 11$p$. In the present embodiment, the shared sections 11 provided at the closest positions in the Y axis direction are disposed to shift in the X axis direction by one pixel region. Although described in detail below, this causes the plurality of red pixel regions 10R and the plurality of blue pixel regions 10B of the imaging unit 111 to each have the first optical characteristic 11$p$ and causes the plurality of green pixel regions 10G of the imaging unit 111 to each have the second optical characteristic 11$m$. This decreases the optical characteristic difference between the plurality of pixel regions that receives light of the same color.

[Operation of Imaging Device 1]

In the imaging device 1, light (e.g., light having a wavelength in a visible region) enters the PD 21 via the on-chip lens 72 and the color filter layer 71. As a result, a pair of a hole and an electron is generated (photoelectrically converted) in the PD 21. In a case where a first transfer signal is inputted to the gate electrode of the TRX 22 and the TRX 22 is turned on, the signal charge accumulated in the PD 21 is transferred to the MEM 23. In a case where the TRG 24 is turned on, the signal charge accumulated in the MEM 23 is transferred to the FD 25. At the FD 25, the signal charge is converted into a voltage signal and this voltage signal is read out as a pixel signal.

[Workings and Effects of Imaging Device 1]

In the imaging device 1 according to the present embodiment, the shared sections 11 provided at the closest positions in the Y axis direction are disposed to shift in the X axis direction by the one pixel region. This brings the components of the plurality of pixel regions closer to each other that receives light of the same color. The following describes these workings with reference to a comparative example.

FIG. 7 illustrates a schematic planar configuration of an imaging device (imaging device 100) according to a comparative example and FIG. 8 is an enlarged view of the configuration of the shared section 11 illustrated in FIG. 7. FIGS. 7 and 8 respectively correspond to FIGS. 2 and 3 each of which illustrates the imaging device 1. This imaging device 100 includes the plurality of shared sections 11 each including two pixel regions adjacent in the X axis direction as with the imaging device 1. In the imaging device 100, the plurality of shared sections 11 that lines up in the Y axis direction is aligned and disposed. In other words, in the imaging device 100, the shared sections 11 provided at the closest positions in the Y axis direction are not disposed to shift. The imaging device 100 is different from the imaging device 1 on this point.

In the imaging device 100 like this, the configuration of the green pixel region 10G is different between the pixel rows. The green pixel regions 10G are each disposed in one (left part of FIG. 7) of the portions of the shared section 11 in a pixel row in which the green pixel regions 10G and the red pixel regions 10R are alternately provided. Each of the green pixel regions 10G thus has the first optical characteristic 11$p$. In contrast, the green pixel regions 10G are each disposed in the other of the portions of the shared section 11 in a pixel row in which the green pixel regions 10G and the blue pixel regions 10B are alternately provided. Each of the green pixel regions 10G thus has the second optical characteristic 11$m$. In other words, the optical characteristic of the green pixel region 10G is different between the pixel rows. Especially the finer green pixel regions 10G tend to have a greater optical characteristic difference. Such an optical characteristic difference between the plurality of green pixel regions 10G results in a periodic streak or the like. This may decrease the image quality.

In addition, in the back-illuminated imaging device 100, the light reflected by the multilayer wiring layer (see the multilayer wiring layer L1 in FIG. 5) easily enters the semiconductor substrate (semiconductor substrate L2 in FIG. 5). The optical characteristic difference between the plurality of green pixel regions 10G brings about greater influence on the image quality than in a front-illuminated imaging device.

In contrast, in the imaging device 1, the shared sections 11 provided at the closest positions in the Y axis direction are disposed to shift in the X axis direction by one pixel region. The green pixel regions 10G are thus each disposed in the other of the portions of the shared section 11 in all the pixel rows of the imaging unit 111. This causes all the green pixel regions 10G of the imaging unit 111 to have substantially the same configuration and each of these has the second optical characteristic 11$m$. This almost eliminates the optical characteristic difference between the plurality of green pixel regions 10G, making it possible to suppress a decrease in image quality. Especially in the back-illuminated imaging device 1, it is possible to effectively suppress a decrease in image quality.

As described above, in the imaging device 1 according to the present embodiment, the shared sections 11 provided at the closest positions in the Y axis direction are disposed to shift in the X axis direction by the one pixel region. This decreases the optical characteristic difference between the plurality of pixel regions that receives light of the same color. This makes it possible to suppress a decrease in image quality caused by the optical characteristic difference between a plurality of pixel regions that receives light of the same color.

The following describes modification examples of the embodiment described above and another embodiment, but the following description denotes the same components as those of the embodiment described above with the same sings and the description thereof is omitted as appropriate.

Modification Example 1

FIG. 9 illustrates a schematic planar configuration of a main portion of an imaging device (imaging device 1A) according to a modification example 1 of the embodiment described above. FIG. 9 corresponds to FIG. 3 illustrating the imaging device 1. This imaging device 1A is provided with an FD transistor (FDG) 29 for each of the shared sections 11 in addition to the RST 26, the AMP 27, and the SEL 28. Except for this point, the imaging device 1A according to the modification example 1 has a configuration similar to that of the imaging device 1 according to the embodiment described above and also has similar workings and effects.

FIG. 10 illustrates an example of a configuration of a pixel circuit of the imaging device 1A. The FDG 29 is a switch transistor for conversion efficiency switching. For example, the FDG 29 is provided between the FD 25 and an additional capacitor (C) 25A. The C 25A is coupled to the FD 25 by turning on the FDG 29. This causes the FD 25 to enter the LG (low gain) state. In contrast, the FD 25 and the C 25A are uncoupled by turning off the FDG 29. This causes the FD 25 to enter the HG (high gain) state.

FIG. 11 illustrates another example of the configuration of the pixel circuit of the imaging device 1A. In this way, the C 25A may be coupled between the FDG 29 and the AMP 27.

In the present modification example, the shared sections 11 provided at the closest positions in the Y axis direction are also disposed to shift in the X axis direction by the one pixel region as in the embodiment described above. This decreases the optical characteristic difference between the plurality of pixel regions that receives light of the same color. In addition, in the present modification example, the pixel circuit includes the FDG 29 and the C 25A. This makes it possible to switch the electric charge capacitance that the FD 25 is able to hold. In other words, it is possible to switch the electric charge voltage conversion efficiency. This makes it possible to generate an optimal image in which the balance between noise and a saturated electric charge amount is taken into consideration. For example, noise is suppressed at low illuminance by increasing the electric charge voltage conversion efficiency and a sufficient saturated electric charge amount is secured at high illuminance by decreasing the electric charge voltage conversion efficiency.

Modification Example 2

Each of FIGS. 12A and 12B illustrates a schematic configuration of a main portion of an imaging device (imaging device 1B) according to a modification example 2 of the embodiment described above. FIG. 12A illustrates a planar configuration of one pixel region (e.g., blue pixel region 10B) of the imaging device 1B and FIG. 12B illustrates a cross-sectional configuration taken along a B-B' line illustrated in FIG. 12A. In this imaging device 1B, the light shielding section 61B has a penetration region T61 and a non-penetration region N61. Similarly, the red pixel region 10R and the green pixel region 10G are also each provided with the penetration region T61 and the non-penetration region N61 of the light shielding section 61B. Except for this point, the imaging device 1B according to the modification example 2 has a configuration similar to that of the imaging device 1 according to the embodiment described above and also has similar workings and effects.

In the penetration region T61, the groove of the groove formation region 42 extends from the first surface L2a to the second surface L2b of the semiconductor substrate L2 (FIG. 12B). The through groove of this semiconductor substrate L2 is filled with the light shielding section 61B. In other words, in the penetration region T61, the light shielding section 61B is provided in the whole of the semiconductor substrate L2 in the thickness direction. This makes it possible to effectively suppress the leakage of light into the MEM 23. In the non-penetration region N61, the groove of the groove formation region 42 is provided at such a depth that the groove does not reach the second surface L2b from the first surface L2a of the semiconductor substrate L2 (see FIG. 5). The non-through groove of this semiconductor substrate L2 is filled with the light shielding section 61B. In other words, in the non-penetration region N61, the light shielding section 61B is provided in a portion of the semiconductor substrate L2 in the thickness direction.

For example, the non-penetration region N61 is provided between the PD 21 and each of the pixel regions (pixel regions adjacent to each other) adjacent in the X axis direction. For example, the penetration region T61 and the non-penetration region N61 are provided between the PD 21 and the MEM 23 of one pixel region. For example, the non-penetration region N61 between the PD 21 and the MEM 23 is provided on the OFG 31 side (left part of FIG. 12A) and signal charge is transferred from the PD 21 to the MEM 23 via this non-penetration region N61. For example, the penetration region T61 and the non-penetration region N61 are provided between the MEM 23 and each of the pixel regions (PDs 21 in adjacent pixel regions) adjacent in the Y axis direction.

In the present modification example, the shared sections 11 provided at the closest positions in the Y axis direction are also disposed to shift in the X axis direction by the one pixel region as in the embodiment described above. This decreases the optical characteristic difference between the plurality of pixel regions that receives light of the same color. In addition, the light shielding section 61B has the penetration region T61 and the non-penetration region N61 as in the present modification example. This tends to increase the difference between the first optical characteristic 11p and the second optical characteristic 11m. The present technology is thus favorably used for the imaging device 1B.

Modification Example 3

FIG. 13 illustrates a schematic cross-sectional configuration of a main portion of an imaging device (imaging device 1C) according to a modification example 3 of the embodiment described above. FIG. 13 corresponds to FIG. 5 illustrating the imaging device 1. In this imaging device 1C, the gate electrode 22G of the TRX 22 is embedded in the semiconductor substrate L2 from the multilayer wiring layer L1. Except for this point, the imaging device 1C according to the modification example 3 has a configuration similar to that of the imaging device 1 according to the embodiment described above and also has similar workings and effects.

The embedded gate electrode 22G like this is provided, for example, between the PD 21 and the MEM 23. The gate electrode 22G penetrates the insulating film 50 from the multilayer wiring layer L1 and is embedded in the semiconductor substrate L2. Providing the gate electrode 22G like this helps transfer signal charge from the PD 21 to the MEM 23. This makes it possible to more reliably transfer signal charge from the PD 21 to the MEM 23.

In the present modification example, the shared sections 11 provided at the closest positions in the Y axis direction are also disposed to shift in the X axis direction by the one pixel region as in the embodiment described above. This decreases the optical characteristic difference between the plurality of pixel regions that receives light of the same color. In addition, the TRX 22 includes the embedded gate electrode 22G as in the present modification example. This makes it possible to more reliably transfer signal charge from the PD 21 to the MEM 23.

Modification Example 4

FIG. 14 illustrates a schematic planar configuration of a main portion of an imaging device (imaging device 1D) according to a modification example 4 of the embodiment described above. FIG. 14 corresponds to FIG. 2 illustrating the imaging device 1. In this imaging device 1D, two pixel regions (the green pixel region 10G and the red pixel region 10R or the green pixel region 10G and the blue pixel region 10B) adjacent in the Y axis direction are included in the shared section 11. Except for this point, the imaging device 1D according to the modification example 4 has a configuration similar to that of the imaging device 1 according to the embodiment described above and also has similar workings and effects.

FIG. 15 illustrates a planar configuration of the two shared sections 11 of the plurality of shared sections 11 illustrated in FIG. 14. The two shared sections 11 are provided at the closest positions in the X axis direction. FIG. 15 corresponds to FIG. 3 illustrating the imaging device 1. In the imaging device 1D, the shared sections 11 provided at the closest positions in the X axis direction are disposed to shift in the Y axis direction by one pixel region. This causes the plurality of red pixel regions 10R and the plurality of blue pixel regions 10B of the imaging unit 111 (FIG. 3) to each have the first optical characteristic 11p and causes the plurality of green pixel regions 10G of the imaging unit 111 to each have the second optical characteristic 11m. This decreases the optical characteristic difference between the plurality of pixel regions that receives light of the same color.

As in the present modification example, the shared sections 11 provided at the closest positions in the X axis direction may be disposed to shift in the Y axis direction by one pixel region. In the imaging device 1D like this, the optical characteristic difference is also decreased between a plurality of pixel regions that receives light of the same color as in the imaging device 1.

Modification Example 5

FIG. 16 illustrates a schematic planar configuration of a main portion of an imaging device (imaging device 1E) according to a modification example 5 of the embodiment described above. FIG. 16 corresponds to FIG. 2 illustrating the imaging device 1. In this imaging device 1E, four close pixel regions (the red pixel region 10R, the blue pixel region 10B, and the two green pixel regions 10G) in the X axis direction and the Y axis direction are included in the shared section 11. Except for this point, the imaging device 1E according to the modification example 5 has a configuration similar to that of the imaging device 1 according to the embodiment described above and also has similar workings and effects.

FIG. 17 illustrates a planar configuration of the one shared section 11 of the plurality of shared sections 11 illustrated in FIG. 16. In the imaging device 1E, for example, the shared section 11 includes two sets of two pixel regions adjacent in the X axis direction (2×2). These two sets are provided at the closest positions in the Y axis direction and disposed to shift in the X axis direction by one pixel region. In other words, only two pixel regions (e.g., the blue pixel region 10B and the green pixel region 10G) of the four pixel regions included in the shared section 11 are provided to be adjacent in the Y axis direction. In the shared section 11 including four pixel regions in this way, for example, the RST 26 and the AMP 27 are provided across the blue pixel region 10B and the green pixel region 10G adjacent in the X axis direction and the SEL 28 is provided across the red pixel region 10R and the green pixel region 10G adjacent in the X axis direction. The respective FDs 25 of the four pixel regions are coupled to each other, for example, by a wiring line 51F. In this way, in the shared section 11 including four pixel regions, two pixel regions adjacent in the X axis direction have a substantially mirror image relationship.

In the imaging device 1E, the shared sections 11 provided at the closest positions in the Y axis direction are disposed to shift in the X axis direction by one pixel region. This causes the plurality of red pixel regions 10R and the plurality of blue pixel regions 10B of the imaging unit 111 (FIG. 3) to each have the first optical characteristic 11p and causes the plurality of green pixel regions 10G of the imaging unit 111 to each have the second optical characteristic 11m as in described in the embodiment described above. This decreases the optical characteristic difference between the plurality of pixel regions that receives light of the same color.

Although not illustrated, the shared section 11 may include two sets of two pixel regions adjacent in the Y axis direction. The shared sections 11 provided at the closest positions in the X axis direction are disposed to shift in the Y axis direction by one pixel region in this case.

FIG. 18 illustrates an example of a configuration of a pixel circuit of the imaging device 1E. The four respective pixel regions included in the shared section 11 include the PDs 21 (PDs 21-1, 21-2, 21-3, and 21-4), the TRXs 22 (TRXs 22-1, 22-2, 22-3, and 22-4), the MEMs 23 (MEMs 23-1, 23-2, 23-3, and 23-4), and the TRGs 24 (TRGs 24-1, 24-2, 24-3, and 24-4). The TRGs 24-1, 24-2, 24-3, and 24-4 are coupled to the FD 25. The RST 26 is coupled to this FD 25 along with the TRGs 24-1, 24-2, 24-3, and 24-4. In addition, the FD 25 is coupled to the vertical signal line VSL via the AMP 27 and the SEL 28. The OFDs 32-1, 32-2, 32-3, and 32-4 are coupled to the PDs 21-1, 21-2, 21-3, and 21-4 via the OFGs 31-1, 31-2, 31-3, and 31-4 along with the TRXs 22-1, 22-2, 22-3, and 22-4.

FIG. 19 illustrates another example of the planar configuration of the shared section 11 illustrated in FIG. 17 and FIG. 20 illustrates an example of a circuit configuration of the shared section 11 illustrated in FIG. 19. The imaging device 1E may include the FDG 29 for each of the shared sections 11 in addition to the RST 26, the AMP 27, and the SEL 28 as described for the imaging device 1A.

As in the present modification example, the shared section 11 may include four close pixel regions in the X axis direction and the Y axis direction. In the imaging device 1E like this, the optical characteristic difference is also decreased between a plurality of pixel regions that receives light of the same color as in the imaging device 1.

Application Example

The imaging devices 1 and 1A to 1E described above are applicable to various types of electronic apparatuses such as a camera, for example. FIG. 21 illustrates a schematic configuration of an electronic apparatus 3 (camera) as an example thereof. This electronic apparatus 3 is, for example, a camera that is able to shoot a still image or a moving image. The electronic apparatus 3 includes the imaging device 1 or 1A to 1E, an optical system (optical lens) 310, a shutter device 311, a driver 313 that drives the imaging device 1 and the shutter device 311, and a signal processor 312.

The optical system 310 guides image light (incident light) from a subject to the imaging device 1. This optical system 310 may include a plurality of optical lenses. The shutter device 311 controls a period in which the imaging device 1 is irradiated with light and a period in which light is blocked. The driver 313 controls a transfer operation of the imaging device 1 and a shutter operation of the shutter device 311. The signal processor 312 performs various kinds of signal processing on a signal outputted from the imaging device 1. An image signal Dout subjected to the signal processing is stored in a storage medium such as a memory or outputted to a monitor or the like.

Further, the imaging devices 1 and 1A to 1E described in the embodiment described above or the like are also applicable to the following electronic apparatuses (a mobile body such as a vehicle).

Practical Application Example to Mobile Body

The technology according to the present disclosure is applicable to a variety of products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (tractor).

FIG. 22 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 22, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 22, an audio speaker 12061, a display section 12062, and an instrument panel 12063 are illustrated as the output device. The display section 12062 may, for example, include at least one of an on-board display and a head-up display.

FIG. 23 is a diagram depicting an example of the installation position of the imaging section 12031.

In FIG. 23, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 23 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has described the example of the vehicle control system to which the technology according to the present disclosure may be applied. The technology according to the present disclosure may be applied to the imaging section 12031 among the components described above. The application of the technology according to the present disclosure to the imaging section 12031 makes it possible to obtain a shot image that is easier to see. This makes it possible to decrease the fatigue of a driver.

The present disclosure has been described above with reference to the embodiment and the modification examples, but the contents of the present disclosure are not limited to the embodiment or the like described above. It is possible to make a variety of modifications. For example, the configuration of the imaging device described in the embodiment or the like described above is an example and another layer may be further included. In addition, a material and the thickness of each layer are also merely examples. Those described above are not limitative.

For example, in the embodiment or the like described above, the case has been described where the shared section 11 includes two pixel regions or four pixel regions, but the number of pixel regions included in the shared section 11 is not limited to these. For example, the shared section 11 may include eight pixel regions.

FIG. 24 illustrates an example of a pixel circuit of an imaging device including the shared section 11 including eight pixel regions. The eight respective pixel regions included in the shared section 11 include the PDs 21 (PDs 21-1, 21-2, 21-3, 21-4, 21-5, 21-6, 21-7, and 21-8), the TRXs 22 (TRXs 22-1, 22-2, 22-3, 22-4, 22-5, 22-6, 22-7, and 22-8), the MEMs 23 (MEMs 23-1, 23-2, 23-3, 23-4, 23-5, 23-6, 23-7, and 23-8), and the TRGs 24 (TRGs 24-1, 24-2, 24-3, 24-4, 24-5, 24-6, 24-7, and 24-8). The TRGs 24-1, 24-2, 24-3, 24-4, 24-5, 24-6, 24-7, and 24-8 are coupled to the FD 25. The RST 26 is coupled to this FD 25 in addition to the TRGs 24-1, 24-2, 24-3, 24-4, 24-5, 24-6, 24-7, and 24-8. In addition, the FD 25 is coupled to the vertical signal line VSL via the AMP 27 and the SEL 28. The OFDs 32-1, 32-2, 32-3, 32-4, 32-5, 32-6, 32-7, and 32-8 are coupled to the PDs 21-1, 21-2, 21-3, 21-4, 21-5, 21-6, 21-7, and 21-8 via the OFGs 31-1, 31-2, 31-3, 31-4, 31-5, 31-6, 31-7, and 31-8 along with the TRXs 22-1, 22-2, 22-3, 22-4, 22-5, 22-6, 22-7, and 22-8.

In addition, FIG. 3 or the like illustrates the example of the planar configuration of the red pixel region 10R, the green pixel region 10G, and the blue pixel region 10B, but the red pixel region 10R, the green pixel region 10G, and the blue pixel region 10B may have another planar configuration.

FIG. 25 illustrates another example of the planar configuration of the red pixel region 10R, the green pixel region 10G, and the blue pixel region 10B. In this way, the TRX 22 (MEM 23) and the TRG 24 may be provided between the PD 21 and the FD 25 in order from the PD 21 side. In a case where the red pixel region 10R, the green pixel region 10G, and the blue pixel region 10B have such a planar configuration, the transfer path of signal charge from the MEM 23 to the FD 25 is shortened.

In addition, the back-illuminated imaging device has been described in the embodiment or the like described above, but the present disclosure may also be used for a front-illuminated imaging device.

It is to be noted that the effects described in the embodiment or the like described above are merely examples. The effects of the present disclosure may be other effects or may further include other effects.

It is to be noted that the present disclosure may have the following configurations. In the imaging device having the following configurations, the shared sections provided at the closest positions in the second direction are disposed to shift in the first direction by the one pixel region. This decreases the optical characteristic difference between the plurality of pixel regions that receives light of the same color. This makes it possible to suppress a decrease in image quality caused by the optical characteristic difference between a plurality of pixel regions that receives light of the same color.

(1)

An imaging device including:

an imaging unit in which a plurality of shared sections each including two pixel regions adjacent at least in a first direction is provided and the shared sections provided at closest positions in a second direction are disposed to shift in the first direction by the one pixel region, the second direction intersecting the first direction;

a photoelectric converter provided for each of the pixel regions;

an electric charge holding unit that holds signal charge generated by the photoelectric converter;

an electric charge voltage converter to which the signal charge is transferred from the electric charge holding unit; and a pixel transistor that is electrically coupled to the electric charge voltage converter, the pixel transistor being provided for each of the shared sections.

(2)

The imaging device according to (1), in which the pixel region includes a first pixel region in which light in a predetermined wavelength range enters the photoelectric converter and a second pixel region in which light in a wavelength range different from a wavelength range of the first pixel region enters the photoelectric converter, and the second pixel region is disposed in one of portions of each of a plurality of the shared sections in the first direction and the second pixel region is disposed in another of the portions in the first direction.

(3)

The imaging device according to (2), in which light in a green wavelength range enters the photoelectric converter in the first pixel region.

(4)

The imaging device according to any one of (1) to (3), further including:

a semiconductor substrate provided with the photoelectric converter, the electric charge holding unit, and the electric charge voltage converter; and a first light shielding section provided between the photoelectric converter and the electric charge holding unit.

(5)

The imaging device according to (4), further including:

a multilayer wiring layer stacked and provided on the semiconductor substrate, the multilayer wiring layer including a wiring line that is electrically coupled to the electric charge voltage converter; and a color filter layer opposed to the multilayer wiring layer with the semiconductor substrate interposed between the color filter layer and the multilayer wiring layer.

(6)

The imaging device according to (4) or (5), in which the first light shielding section has a penetration region and a non-penetration region, the penetration region being provided by penetrating the semiconductor substrate in a thickness direction, the non-penetration region being provided in a portion of the semiconductor substrate in the thickness direction.

(7) The imaging device according to any one of (1) to (6), further including a second light shielding section provided on a light incidence side of the photoelectric converter, the second light shielding section covering the electric charge holding unit and having an opening in a region opposed to the photoelectric converter, in which
the imaging unit and the opening each have a rectangular planar shape having a long side in the first direction.

(8) The imaging device according to any one of (1) to (7), in which the photoelectric converter and the electric charge holding unit are provided to line up in the second direction.

(9) The imaging device according to any one of (1) to (8), in which the shared sections each include the four close pixel regions in the first direction and the second direction.

(10) The imaging device according to any one of (1) to (9), further including:
a first transfer transistor that transfers the signal charge from the photoelectric converter to the electric charge holding unit; and
a second transfer transistor that transfers the signal charge from the electric charge holding unit to the electric charge voltage converter.

(11) The imaging device according to any one of (1) to (10), in which the pixel transistor includes at least any one of a reset transistor, an amplification transistor, or a selection transistor.

The present application claims the priority on the basis of Japanese Patent Application No. 2019-006285 filed on Jan. 17, 2019 with Japan Patent Office, the entire contents of which are incorporated in the present application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device, comprising:
an imaging unit in which a plurality of shared sections each including two pixel regions adjacent at least in a first direction is provided and shared sections, of the plurality of shared sections, provided at closest positions in a second direction are disposed to shift in the first direction by one pixel region, the second direction intersecting the first direction;
a photoelectric converter provided for each of the two pixel regions;
an electric charge holding unit configured to hold signal charge generated by the photoelectric converter;
an electric charge voltage converter to which the signal charge is transferred from the electric charge holding unit;
a pixel transistor that is electrically coupled to the electric charge voltage converter, the pixel transistor being provided for each of the plurality of shared sections;
a semiconductor substrate provided with the photoelectric converter, the electric charge holding unit, and the electric charge voltage converter; and
a first light shielding section provided between the photoelectric converter and the electric charge holding unit, wherein
the first light shielding section has a penetration region and a non-penetration region,
the penetration region is provided by penetration of the semiconductor substrate in a thickness direction, and
the non-penetration region is provided in a portion of the semiconductor substrate in the thickness direction.

2. The imaging device according to claim 1, wherein
the two pixel regions includes a first pixel region in which light in a specific wavelength range enters the photoelectric converter and a second pixel region in which light in a wavelength range, different from the specific wavelength range of the first pixel region, enters the photoelectric converter, and
the second pixel region is disposed in one of portions of each of the plurality of shared sections in the first direction and the second pixel region is disposed in another of the portions in the first direction.

3. The imaging device according to claim 2, wherein light in a green wavelength range enters the photoelectric converter in the first pixel region.

4. The imaging device according to claim 1, further comprising:
a multilayer wiring layer stacked and provided on the semiconductor substrate, the multilayer wiring layer including a wiring line that is electrically coupled to the electric charge voltage converter; and
a color filter layer opposed to the multilayer wiring layer with the semiconductor substrate interposed between the color filter layer and the multilayer wiring layer.

5. The imaging device according to claim 1, further comprising a second light shielding section provided on a light incidence side of the photoelectric converter, the second light shielding section covering the electric charge holding unit and having an opening in a region opposed to the photoelectric converter, wherein
the imaging unit and the opening each have a rectangular planar shape having a long side in the first direction.

6. The imaging device according to claim 1, wherein the photoelectric converter and the electric charge holding unit are provided to line up in the second direction.

7. The imaging device according to claim 1, wherein each of the plurality of shared sections include four close pixel regions in the first direction and the second direction.

8. The imaging device according to claim 1, further comprising:
a first transfer transistor configured to transfer the signal charge from the photoelectric converter to the electric charge holding unit; and
a second transfer transistor configured to transfer the signal charge from the electric charge holding unit to the electric charge voltage converter.

9. The imaging device according to claim 1, wherein the pixel transistor includes at least any one of a reset transistor, an amplification transistor, or a selection transistor.

10. An imaging device, comprising:
an imaging unit in which a plurality of shared sections each including two pixel regions adjacent at least in a first direction is provided and shared sections, of the plurality of shared sections, provided at closest positions in a second direction are disposed to shift in the first direction by one pixel region, the second direction intersecting the first direction;

a photoelectric converter provided for each of the two pixel regions;

an electric charge holding unit configured to hold signal charge generated by the photoelectric converter;

an electric charge voltage converter to which the signal charge is transferred from the electric charge holding unit;

a pixel transistor that is electrically coupled to the electric charge voltage converter, the pixel transistor being provided for each of the plurality of shared sections;

a semiconductor substrate provided with the photoelectric converter, the electric charge holding unit, and the electric charge voltage converter;

a first light shielding section provided between the photoelectric converter and the electric charge holding unit;

a multilayer wiring layer stacked and provided on the semiconductor substrate, the multilayer wiring layer including a wiring line that is electrically coupled to the electric charge voltage converter; and a color filter layer opposed to the multilayer wiring layer with the semiconductor substrate interposed between the color filter layer and the multilayer wiring layer.

* * * * *